(12) United States Patent
Sameshima

(10) Patent No.: US 11,378,619 B2
(45) Date of Patent: Jul. 5, 2022

(54) DOUBLE-SIDED PROBE SYSTEMS WITH THERMAL CONTROL SYSTEMS AND RELATED METHODS

(71) Applicant: FormFactor, Inc., Livermore, CA (US)

(72) Inventor: Masahiro Sameshima, Tokyo (JP)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 17/111,283

(22) Filed: Dec. 3, 2020

(65) Prior Publication Data

US 2021/0190860 A1        Jun. 24, 2021

Related U.S. Application Data

(60) Provisional application No. 62/949,921, filed on Dec. 18, 2019.

(51) Int. Cl.
*G01R 31/28*        (2006.01)
*G01R 1/44*         (2006.01)
*G01R 31/319*       (2006.01)

(52) U.S. Cl.
CPC ........... *G01R 31/2891* (2013.01); *G01R 1/44* (2013.01); *G01R 31/2874* (2013.01); *G01R 31/31905* (2013.01)

(58) Field of Classification Search
CPC ........ H01L 21/67248; H01L 21/68764; H01L 21/66; H01L 22/34; H01L 31/024;

(Continued)

(56) References Cited

U.S. PATENT DOCUMENTS 5,493,236 A  *  2/1996  Ishii .................. G01R 31/2656
                                            324/501
6,515,494 B1 *  2/2003  Low ..................... G01N 21/9501
                                            324/501

(Continued)

FOREIGN PATENT DOCUMENTS

JP      2011138865          7/2011
JP      2019075434      *   5/2019    ............. G01R 31/26

OTHER PUBLICATIONS

English-language abstract of Japanese Patent No. 2011138865, Jul. 14, 2011.

*Primary Examiner* — Vinh P Nguyen
(74) *Attorney, Agent, or Firm* — Dascenzo Gates Intellectual Property Law, P.C.

(57) ABSTRACT

Double-sided probe systems with thermal control systems and related methods. Thermally-controlled, double-sided probe systems include a probe assembly configured to test one or more devices under test (DUTs) of a substrate and a chuck configured to support the substrate. The probe assembly includes a thermal control system configured to at least partially control a substrate temperature of the substrate while the probe assembly tests the DUT(s). The chuck is configured to support the substrate such that the probe assembly has access to each of a first substrate side of the substrate and a second substrate side of the substrate while the substrate is operatively supported by the chuck. In some examples, methods of operating double-sided probe systems include regulating the substrate temperature with the thermal control system.

25 Claims, 7 Drawing Sheets

(58) Field of Classification Search
CPC ..... H01L 21/67; G01R 31/26; G01R 31/2868; G01R 1/07342; G01R 31/002; G01R 31/2887; G01R 31/2851; G01R 31/311; G01R 1/06705; G01R 31/2874; G01R 31/2648; G01R 31/265; G01R 1/0408; G01R 31/2865; G01R 31/2881; G01R 31/2886; G01R 31/302; G01R 1/44; G01R 31/2891; G01R 31/31905; G01R 1/0491; G02B 6/4206; G02B 6/4257; G02B 21/0048; G02B 7/008; G02B 6/4292; G02B 6/4271; G02B 21/0052; G02B 21/26; G02B 21/28; G02B 21/30; G06T 2207/30148; G06T 2207/20212; G06T 7/00; G06T 7/0008; G06T 2207/10152

See application file for complete search history.

(56) References Cited

U.S. PATENT DOCUMENTS

| | | | |
|---|---|---|---|
| 6,809,534 B2 * | 10/2004 | Yamada | G01R 31/307 324/754.22 |
| 9,207,276 B2 | 12/2015 | Bieck | |
| 10,060,963 B2 * | 8/2018 | McMullen | G01R 31/2874 |
| 10,365,323 B2 * | 7/2019 | Andrews | G01R 31/2891 |
| 2002/0017916 A1 | 2/2002 | Costello et al. | |
| 2002/0030500 A1 * | 3/2002 | Akikuni | G01R 31/311 324/754.23 |
| 2002/0050834 A1 | 5/2002 | Olsen et al. | |
| 2007/0159194 A1 | 7/2007 | Hasegawa et al. | |
| 2014/0028337 A1 | 1/2014 | Kiesewetter et al. | |

* cited by examiner

DOUBLE-SIDED PROBE SYSTEMS WITH THERMAL CONTROL SYSTEMS AND RELATED METHODS

RELATED APPLICATION

This application claims priority to U.S. Provisional Patent Application No. 62/949,921, which is entitled DOUBLE-SIDED PROBE SYSTEMS WITH THERMALLY CONTROLLED PROBE HEADS, was filed on Dec. 18, 2019, and the complete disclosure of which is hereby incorporated by reference.

FIELD OF THE DISCLOSURE

The present disclosure relates generally to probe systems and more specifically to double-sided probe systems with thermal control systems for controlling a temperature of a substrate during testing of both sides of the substrate.

BACKGROUND OF THE DISCLOSURE

Probe systems may be utilized to test operation and/or performance of a device under test (DUT). Probe systems generally include one or more probes that may be configured to provide a test signal to the DUT and/or to receive a resultant signal from the DUT. By measuring the response of the DUT to the test signal (e.g., by measuring and/or quantifying the resultant signal), the operation and/or performance of the DUT may be quantified.

Under certain circumstances, it may be desirable to test the DUT under controlled environmental conditions. As an example, it may be desirable to test the DUT at a predetermined temperature. In some such examples, the temperature of the DUT is controlled by controlling the temperature of a temperature-controlled chuck that supports a substrate that includes the DUT. However, utilizing a temperature-controlled chuck in this manner generally does not permit concurrent testing of both sides of the substrate. Thus, there exists a need for improved double-sided probe systems with thermal control systems.

SUMMARY OF THE DISCLOSURE

Double-sided probe systems with thermal control systems and related methods are disclosed herein. Thermally-controlled, double-sided probe systems include a probe assembly configured to test one or more devices under test (DUTs) of a substrate and a chuck configured to support the substrate. The probe assembly includes a thermal control system configured to at least partially control a substrate temperature of the substrate while the probe assembly tests the DUT(s). The chuck is configured to support the substrate such that the probe assembly has access to each of a first substrate side of the substrate and a second substrate side of the substrate while the substrate is operatively supported by the chuck. In some examples, methods of operating double-sided probe systems include regulating the substrate temperature with the thermal control system.

DETAILED DESCRIPTION AND BEST MODE OF THE DISCLOSURE

FIGS. 1-10 provide examples of thermally controlled probe heads 140, of double-sided probe systems 10 that include thermally controlled probe heads 140, and/or of methods 200 of operating double-sided probe systems 10, according to the present disclosure. Elements that serve a similar, or at least substantially similar, purpose are labeled with like numbers in FIGS. 1-10, and these elements may not be discussed in detail herein with reference to each of FIGS. 1-10. Similarly, all elements may not be labeled in FIGS. 1-10, but reference numbers associated therewith may be utilized herein for consistency. Elements, components, and/or features that are discussed herein with reference to FIGS. 1-10 may be included in and/or utilized with the subject matter of FIGS. 1-10 without departing from the scope of the present disclosure. In general, elements that are likely to be included in a particular embodiment are illustrated in solid lines, while elements that are optional are illustrated in dashed lines. However, elements that are shown in solid lines may not be essential and, in some embodiments, may be omitted without departing from the scope of the present disclosure.

Figure 1:
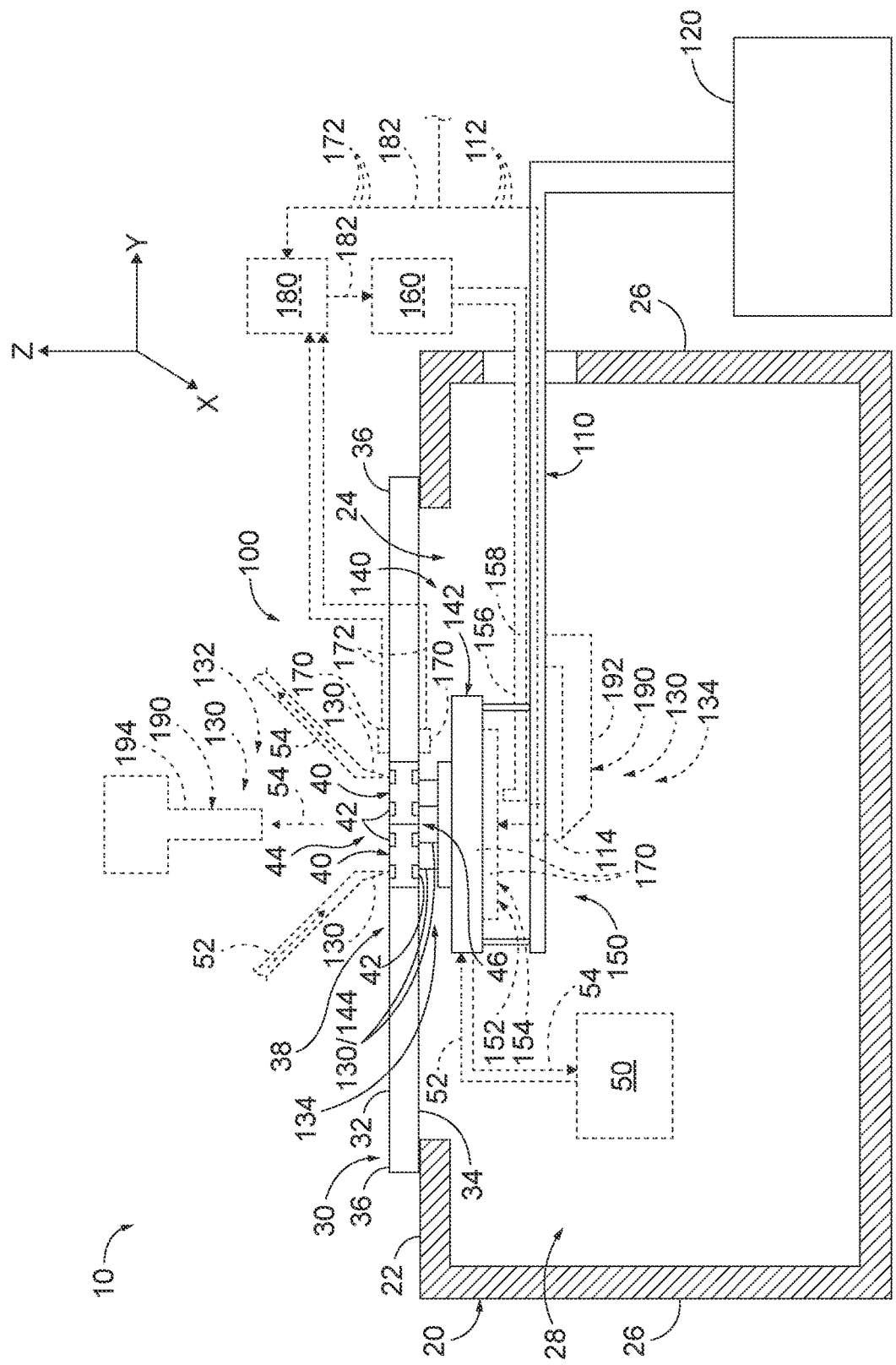
FIG. 1 is a schematic cross-sectional view representing examples of double-sided probe systems according to the present disclosure.

As schematically illustrated in FIG. 1, double-sided probe systems 10 may be adapted, configured, designed, shaped, sized, and/or constructed to test one or more devices under test (DUTs) 40, which may be formed on, supported by, and/or included in a substrate 30. Specifically, and as illustrated in FIG. 1, double-sided probe systems 10 include a probe assembly 100 configured to test DUT(s) 40. As further schematically illustrated in FIG. 1, probe assembly 100 includes a thermal control system 150 that is configured to at least partially control a substrate temperature of substrate 30 while probe assembly 100 tests DUT(s) 40, such as to facilitate testing the DUT(s) in any of a variety of controlled thermal conditions.

In some examples, and as schematically illustrated in FIG. 1, probe assembly 100 includes a thermally controlled probe head 140 that is configured to test at least one DUT 40 of substrate 30. In some examples, thermally controlled probe head 140 includes and/or supports at least a portion of thermal control system 150. Specifically, in such examples, probe assembly 100 is configured such that thermally controlled probe head 140 is in thermal communication with substrate 30 when probe assembly 100 tests DUT 40. Thus, controlling a probe head temperature of at least a portion and/or region of thermally controlled probe head 140 facilitates control of the substrate temperature. In this manner, double-sided probe systems 10 according to the present disclosure also may be referred to as temperature-controlled double-sided probe systems 10. FIGS. 2-9 provide less schematic illustrations of examples of thermally controlled probe heads 140, of portions thereof, and/or of associated structures of probe assembly 100, as described in more detail below.

In some examples, thermal control system 150 may be configured to at least partially control the substrate temperature and/or the probe head temperature while the thermally controlled probe head tests DUT(s) 40. More specifically, in some examples, thermal control system 150 is configured to at least partially control the probe head temperature and/or to facilitate thermal communication between thermally controlled probe head 140 and substrate 30 such that the thermal control system and/or the thermally controlled probe head at least partially regulates the substrate temperature.

Substrate 30 may include and/or be any suitable structure that may support, include, and/or have formed thereon DUT(s) 40. Examples of substrate 30 include a wafer, a semiconductor wafer, a silicon wafer, and/or a gallium arsenide wafer. Similarly, DUT(s) 40 each may include and/or be any suitable structure that may be probed and/or tested by double-sided probe system 10. As examples, each DUT 40 may include a semiconductor device, an electronic device, an optical device, an optoelectronic device, a logic device, a power device, a switching device, and/or a transistor.

As schematically illustrated in FIG. 1, double-sided probe systems 10 include a chuck 20 that operatively supports substrate 30 during testing of DUT 40 and is distinct and/or spaced-apart from probe assembly 100. More specifically, as schematically illustrated in FIG. 1 and as described in more detail herein, chuck 20 is configured to support substrate 30 such that probe assembly 100 has access to each of a first substrate side 32 of substrate 30 and a second substrate side 34 of substrate 30 that is opposite first substrate side 32 while substrate 30 is operatively supported by chuck 20. In this manner, probe assembly 100 may be configured to access, test, engage, and/or otherwise interface with both of first substrate side 32 and second substrate side 34 concurrently, while the substrate is positioned on the chuck, and/or without repositioning substrate 30 upon chuck 20.

As used herein, probe assembly 100 may be described as "having access to" a portion of substrate 30 (such as first substrate side 32 and/or second substrate side 34), and/or as being operable to test a portion of the substrate, when the portion of the substrate is exposed and/or unblocked such that probe assembly 100 may make a physical, electrical, and/or optical contact and/or non-contact interface and/or measurement of the portion of substrate 30. Similarly, probe assembly 100 may be described as testing a portion of substrate 30 and/or DUT(s) 40 associated with substrate 30 when probe assembly 100 interacts with substrate 30 and/or DUT(s) 40 in any of a variety of manners. As examples, probe assembly 100 may be described as testing a portion of substrate 30 and/or DUT(s) 40 when the probe assembly operates to send an electrical and/or electromagnetic signal to the DUT(s), to receive an electrical and/or electromagnetic signal from the DUT(s), and/or to perform a visual inspection of the substrate and/or of the DUT(s).

In this manner, chuck 20 also may be described as being configured to support substrate 30 such that probe assembly 100 is operable to test each of first substrate side 32 and second substrate side 34 concurrently and/or without repositioning substrate 30 upon chuck 20. As a more specific example, probe assembly 100 may be configured to test one of first substrate side 32 and second substrate side 34 via an electrical connection, such as by providing an electrical signal. Concurrently, probe assembly 100 may be configured to test the other of first substrate side 32 and second substrate side 34 via an optical measurement, such as by receiving an optical signal, such as may correspond to, or result from, the electrical signal supplied to the opposite side of substrate 30. As used herein, probe assembly 100 also may be described as testing first substrate side 32 and/or second substrate side 34 when probe assembly 100 tests DUT(s) 40 formed on and/or accessible via the first substrate side and/or the second substrate side, respectively.

As more specific examples, and as schematically illustrated in FIG. 1, probe assembly 100 may be configured to transmit a test signal 52 to first substrate side 32 and/or to second substrate side 34 and/or to receive a resultant signal 54 from first substrate side 32 and/or from second substrate side 34. In some such examples, resultant signal 54 corresponds to, and/or is at least partially based upon, test signal 52. In this manner, a measurement of resultant signal 54 produced by DUT 40 in response to test signal 52 may be utilized to characterize and/or evaluate DUT 40. Test signal 52 may include and/or be any of a variety of signals, examples of which include an electric test signal, a direct current test signal, an alternating current test signal, an analog test signal, a digital test signal, and/or an optical test signal. In some examples, and as schematically illustrated in FIG. 1, double-sided probe systems 10 additionally include a signal generation and analysis assembly 50 that is configured to provide test signal 52 to probe assembly 100 and/or to receive resultant signal 54 from probe assembly 100. In some examples, signal generation and analysis assembly 50 additionally or alternatively is configured to analyze resultant signal 54, such as to characterize DUT(s) 40.

Chuck 20 may be configured to operatively support substrate 30 in any of a variety of manners that permit, facilitate, and/or allow for double-sided testing of the substrate. In some examples, and as schematically illustrated in FIG. 1, substrate 30 may be operatively supported by chuck 20 such that second substrate side 34, or a region of second substrate side 34, faces and/or engages chuck 20. In such examples, first substrate side 32 also may be referred to as an upper substrate side, and/or second substrate side 34 also may be referred to as a lower substrate side. However, this is not required, and it is additionally within the scope of the present disclosure that first substrate side 32 may be the lower substrate side and/or may engage and/or face chuck 20, and/or that second substrate side 34 may be the upper substrate side.

As used herein, positional terms such as "upper," "above," "over," "lower," "below," "underneath," and the like generally refer to relative positions along a vertical direction, such as along the Z-direction that is illustrated in FIG. 1. For example, FIG. 1 may be described as schematically illustrating a configuration in which thermally controlled probe head 140 is positioned under substrate 30. However, such configurations are not required, and it is additionally within the scope of the present disclosure that thermally controlled probe head 140 and/or any other component of probe assembly 100 may have any suitable orientation relative to substrate 30.

In some examples, and as schematically illustrated in FIG. 1, chuck 20 is configured to contact substrate 30 only along a peripheral region 36 of substrate 30. As used herein, and as schematically illustrated in FIG. 1, peripheral region 36 of substrate 30 may refer to any suitable region of substrate 30, such as of first substrate side 32 and/or of second substrate side 34, that at least partially bounds, surrounds, encloses, and/or encompasses a central region 38 of substrate 30 that is accessible to and/or that is tested by probe assembly 100. More specifically, in some examples, and as schematically illustrated in FIG. 1, chuck 20 includes a chuck support surface 22 that is configured to contact second substrate side 34 along peripheral region 36 of substrate 30. Chuck support surface 22 may support peripheral region 36 of substrate 30 along a full perimeter of substrate 30, or may support peripheral region 36 along a region of substrate 30, and/or along a plurality of spaced-apart regions of substrate 30.

In some examples, and as schematically illustrated in FIG. 1, chuck 20 includes and/or defines a chuck open region 24 such that probe assembly 100 is configured to test first substrate side 32 or (as illustrated in FIG. 1) second substrate side 34 via chuck open region 24. As a more specific example, and as schematically illustrated in FIG. 1, chuck support surface 22 may at least partially bound and/or define chuck open region 24 such that probe assembly 100 is configured to test second substrate side 34 of substrate 30 via chuck open region 24. In some examples, chuck open region 24 includes, is, and/or may be described as an aperture, a gap, a channel, and/or a hole.

In some examples, and as schematically illustrated in FIG. 1, chuck 20 includes one or more chuck walls 26 and a chuck internal volume 28 that is at least partially bounded by chuck wall(s) 26 and/or chuck support surface 22. In some such examples, and as schematically illustrated in FIG. 1, thermally controlled probe head 140 is positioned at least partially within chuck internal volume 28 during operative use of double-sided probe systems 10. In some examples, chuck wall(s) 26 include, support, and/or at least partially define chuck support surface 22.

The present disclosure generally relates to examples in which double-sided probe systems 10 are operatively utilized in conjunction with substrate 30, for example, such that probe assembly 100 is operable to test DUT(s) 40. Stated differently, double-sided probe systems 10 and/or probe assembly 100 may be described as being "in operative use" and/or as being "operatively utilized" when chuck 20 supports substrate 30 such that probe assembly 100 is operable to test DUT(s) 40. However, such examples are not limiting, and it is additionally within the scope of the present disclosure that double-sided probe system 10 is not always operatively utilized in conjunction with substrate 30. For example, while the present disclosure generally describes thermal control system 150 as being in thermal communication with substrate 30, such examples are not intended as implying that substrate 30 is required to be a component of double-sided probe system 10 and/or that substrate 30 is always present in examples of double-sided probe systems 10.

As used herein, a first component may be described as being in thermal communication with a second component when the first component and the second component are positioned, oriented, and/or otherwise mutually configured such that heat energy may transfer between the first component and the second component. This heat energy may transfer in sufficient quantity to permit and/or facilitate selective control of the temperature of one of the first component and the second component via regulation of the temperature of the other of the first component and the second component. In this manner, controlling and/or regulating a temperature of a first component that is in thermal communication with a second component thus may operate to control and/or regulate a temperature of the second component.

As described in more detail herein, double-sided probe systems 10 according to the present disclosure generally are configured such that thermal control system 150 is distinct from chuck 20. Specifically, in various examples, thermal control system 150 is spaced apart from chuck 20 and/or is not in direct and/or indirect mechanical communication with chuck 20. Additionally or alternatively, at least a region of the thermal control system may be configured to move, to operatively translate, and/or to operatively rotate relative to chuck 20.

In this manner, thermal control system 150 is distinct from prior art probe systems that include chucks, such as thermally-controlled chucks, that are utilized to regulate a substrate temperature. Because such prior art thermally-controlled chucks generally require close proximity and/or direct contact with regions of the substrates to be thermally regulated by the chucks, such configurations generally are not suitable for double-sided testing of the substrate as described herein. By contrast, and as described in more detail herein, separating thermal control system 150 of double-sided probe systems 10 from chuck 20 may permit, facilitate, and/or allow for precise and accurate temperature regulation of substrate 30 during double-sided testing of the substrate.

Thermally controlled probe head 140 according to the present disclosure may permit, facilitate, and/or allow for control of the substrate temperature with a greater operational range, with a finer precision, and/or with finer spatial resolution when compared to prior art probe systems that do not establish thermal communication between probe assembly 100 and substrate 30 and/or that do not include thermally controlled probe head 140. As examples, double-sided probe system 10 may be configured to bring substrate 30 to a maximum temperature that is at least 60 degrees Celsius, at least 70 degrees Celsius, at least 80 degrees Celsius, at least 90 degrees Celsius, at most 100 degrees Celsius, at most 85 degrees Celsius, at most 75 degrees Celsius, and/or at most 65 degrees Celsius. Additionally or alternatively, double-sided probe system 10 may be configured to maintain the substrate temperature at a temperature that differs from a target, or desired, temperature and/or that differs across a tested region of the substrate by at most 5 degrees Celsius, at most 3 degrees Celsius, at most 2 degrees Celsius, at most 1 degree Celsius, and/or at most 0.5 degrees Celsius.

Probe assembly 100 and/or thermally controlled probe head 140 may be configured to test DUT 40 in any appropriate manner. In some examples, and as schematically illustrated in FIG. 1, probe assembly 100 includes one or more probes 130 for testing DUT 40. In some examples, and as schematically illustrated in FIG. 1, each probe 130 is configured to provide test signal 52 to a corresponding DUT 40 and/or to receive resultant signal 54 from the corresponding DUT. More specifically, in such examples, and as schematically illustrated in FIG. 1, probe assembly 100 and/or each probe 130 thereof may be configured to interface with one or more testing locations 42 of substrate 30 to test the substrate. In some such examples, and as schematically illustrated in FIG. 1, each DUT 40 includes at least one corresponding testing location 42. As examples, each testing location 42 may include and/or be a contact pad, a solder bump, an optical coupler, etc. Additionally or alternatively, and as described in more detail herein, an example of probe 130 may be configured to test a corresponding testing location 42 in the form of a region of substrate 30 that may include one or more DUTs 40 and/or one or more testing locations 42 that are configured to be tested by one or more other probes 130 of probe assembly 100.

Each probe 130 may have any appropriate form and/or structure for testing DUT 40. As an example, probe 130 may be a vertical probe, such as may be configured to contact testing location 42 in the form of a solder bump of a corresponding DUT 40. As another example, and as schematically illustrated in FIG. 1, probe 130 may be a cantilever probe that is configured to contact testing location 42 in the form of a contact pad of a corresponding DUT 40. In other examples, at least one probe 130 may be configured for non-contact testing of DUT 40. For example, at least one probe 130 may be an optical probe and/or a probe antenna, such as a probe that is configured to be optically and/or electromagnetically coupled to testing location 42 for non-contact testing of DUT 40. Additionally or alternatively, probe 130 may be configured to perform non-contact testing of substrate 30 and/or DUT(s) 40 by receiving light from substrate 30 to generate an optical image of substrate 30 and/or DUT(s) 40. In such examples, the region of substrate 30 and/or DUT(s) 40 that is viewed and/or imaged by probe 130 may be described as testing location 42. Similarly, in such examples, probe 130 may be described as testing substrate 30 and/or DUT(s) 40 by receiving light from the substrate and/or the DUT(s) to generate the optical image.

In some examples, testing location(s) 42 of substrate 30 may be characterized according to the location of each testing location on the substrate. For example, and as schematically illustrated in FIG. 1, each testing location 42 may be a member of a first testing location subset 44 and/or of a second testing location subset 46. Specifically, in such examples, and as schematically illustrated in FIG. 1, each testing location 42 of first testing location subset 44 is formed on, and/or configured to be tested via, first substrate side 32, and each testing location 42 of second testing location subset 46 is formed on, and/or configured to be tested, or concurrently tested, via second substrate side 34.

In some examples, and as schematically illustrated in FIG. 1, thermally controlled probe head 140 includes at least a subset of the probes 130 of probe assembly 100. For example, and as schematically illustrated in FIG. 1, the probes 130 of probe assembly 100 may be described as including a first probe subset 132 and/or a second probe subset 134. Specifically, in such examples, each probe 130 of first probe subset 132 is operable to test one or more DUTs 40 of substrate 30 via first substrate side 32, such as by interfacing with a respective testing location 42 of first testing location subset 44. Similarly, in such examples, each probe 130 of second probe subset 134 is operable to test one or more DUTs 40 of substrate 30 via second substrate side 34, such as by interfacing with a respective testing location 42 of second testing location subset 46. In some such examples, thermally controlled probe head 140 supports and/or includes at least a portion of second probe subset 134. More specifically, in some such examples, and as schematically illustrated in FIG. 1, at least a portion of second probe subset 134 (such as each probe supported by thermally controlled probe head 140) extends between thermal control system 150 and substrate 30 during operative use of double-sided probe system 10.

In some examples, and as schematically illustrated in FIG. 1, one or more probes 130 of probe assembly 100 may be referred to as thermally controlled probes 144. For example, each probe 130 of thermally controlled probe head 140 may be described as a thermally controlled probe 144. Additionally or alternatively, second probe subset 134 may include and/or consist of each thermally controlled probe 144.

In various examples, and as described in more detail herein, thermal control system 150 is operable to control the substrate temperature via conductive heat transfer, convective heat transfer, and/or radiative heat transfer between one or more components of thermally controlled probe head 140 and substrate 30. In some examples, and as schematically illustrated in FIG. 1, thermally controlled probe head 140 includes a base plate 142 that is configured to be spaced apart from substrate 30 during operative use of double-sided probe system 10, and each thermally controlled probe 144 is operatively supported by base plate 142. In some such examples, and as described in more detail herein, base plate 142 is configured to be in thermal communication with substrate 30 during operative use of double-sided probe system 10, such as in convective and/or radiative thermal communication with substrate 30, and thermal control system 150 is configured to selectively control a base plate temperature of the base plate, such as to permit, facilitate, and/or allow for regulation of the substrate temperature. In some such examples, the probe head temperature may include and/or be the base plate temperature. In this manner, in some examples, and as described in more detail herein, thermal control system 150 is configured to at least partially control the substrate temperature via selective and dynamic control of a temperature of at least a portion and/or region of thermally controlled probe head 140, such as base plate 142. In particular, base plate 142 may have a thermal mass that is sufficiently large to resist temperature variations in base plate 142 and/or substrate 30. As more specific examples, base plate 142 may be configured such that a ratio of the thermal mass of the base plate to a total thermal mass of thermally controlled probe(s) 144 is at least 100, at least 1,000, at least 10,000, at least 100,000, and/or at least 1,000,000.

As discussed, in various examples, probe assembly 100 is configured to access, or to concurrently access, each of first substrate side 32 and second substrate side 34 during operative use of double-sided probe system 10. For example, double-sided probe system 10 may be configured such that each thermally controlled probe 144 of thermally controlled probe head 140 is in direct contact and/or thermal communication with one of first substrate side 32 and second substrate side 34 and such that at least a portion of probe assembly 100 is in electrical and/or optical communication with the other of the first substrate side and the second substrate side. In this manner, thermally controlled probe head 140 may be configured to at least partially control the substrate temperature while another portion of double-sided probe system 10 performs optical and/or electrical measurements on an opposite side of substrate 30.

Thermal control system 150 may include any of a variety of structures and/or mechanisms for adding heat energy to and/or removing heat energy from substrate 30. As an example, and as schematically illustrated in FIG. 1, thermal control system 150 may include a heater plate 152 that is configured generate heat energy and/or to convey the heat energy to substrate 30. In such examples, and as schematically illustrated in FIG. 1, heater plate 152 is configured to be spaced apart from substrate 30 during operative use of double-sided probe systems 10. In some examples, heater plate 152 is configured to be in thermal communication with base plate 142 and/or with substrate 30. In such examples, thermal control system 150 is configured to selectively vary a heater plate temperature of heater plate 152 to selectively and dynamically control the base plate temperature and/or the substrate temperature. In some such examples, the probe head temperature may include and/or be the heater plate temperature. In this manner, heater plate 152 may be configured to heat substrate 30 and/or DUT 40 via conductive, convective, and/or radiative heat transfer. As a more specific example, heater plate 152 may be configured to heat base plate 142 at least partially via conductive heat transfer, and the base plate in turn may be configured to heat substrate 30 via convective and/or radiative heat transfer. Heater plate 152 may be configured to generate heat energy in any appropriate manner, such as via resistive heating generated by an electric current. More specific examples of heater plate 152 include a resistive heater and/or a radiative heater.

Figure 2:
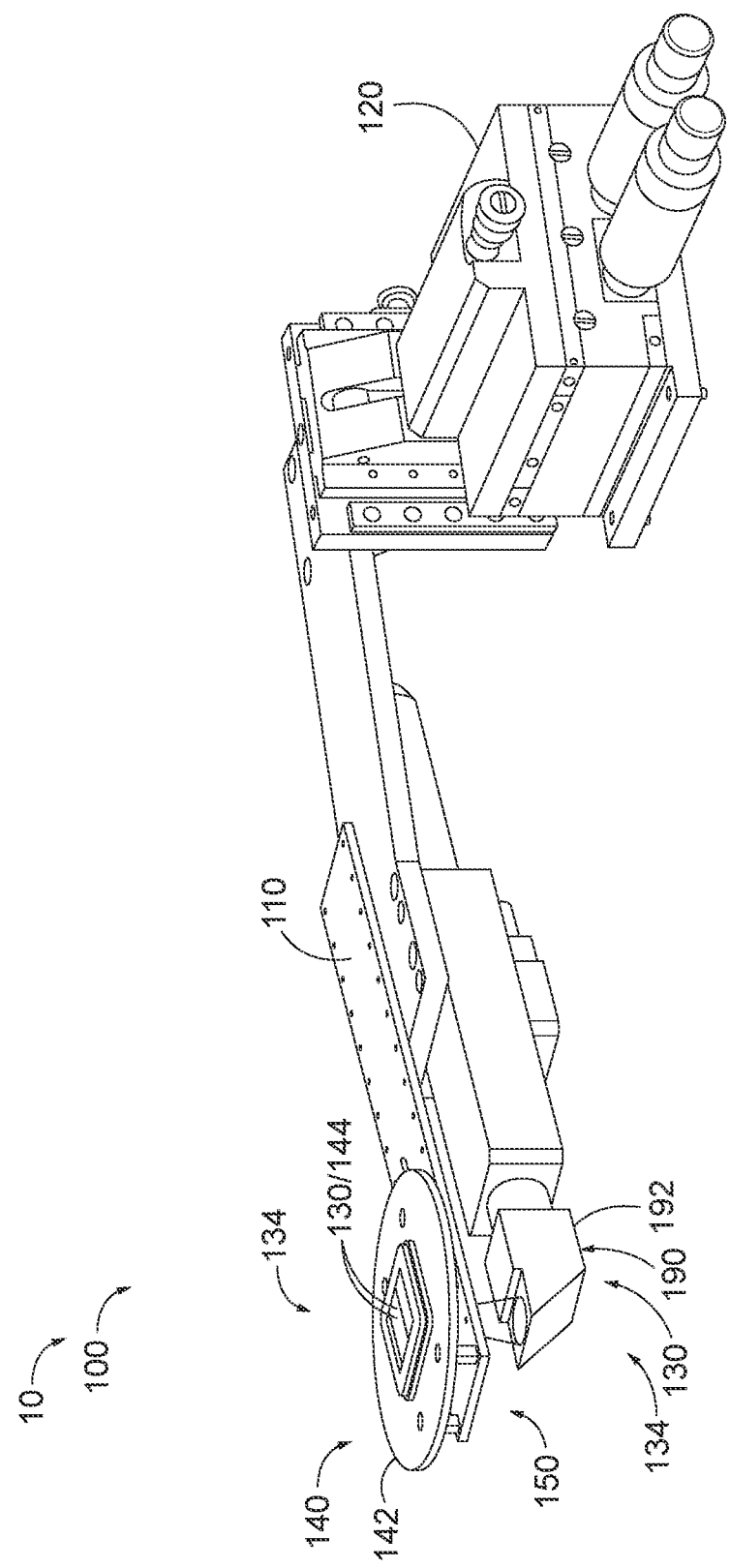
FIG. 2 is a top side isometric view of an example of a support arm, a positioner stage, and a thermally controlled probe head, according to the present disclosure.
Figure 3:
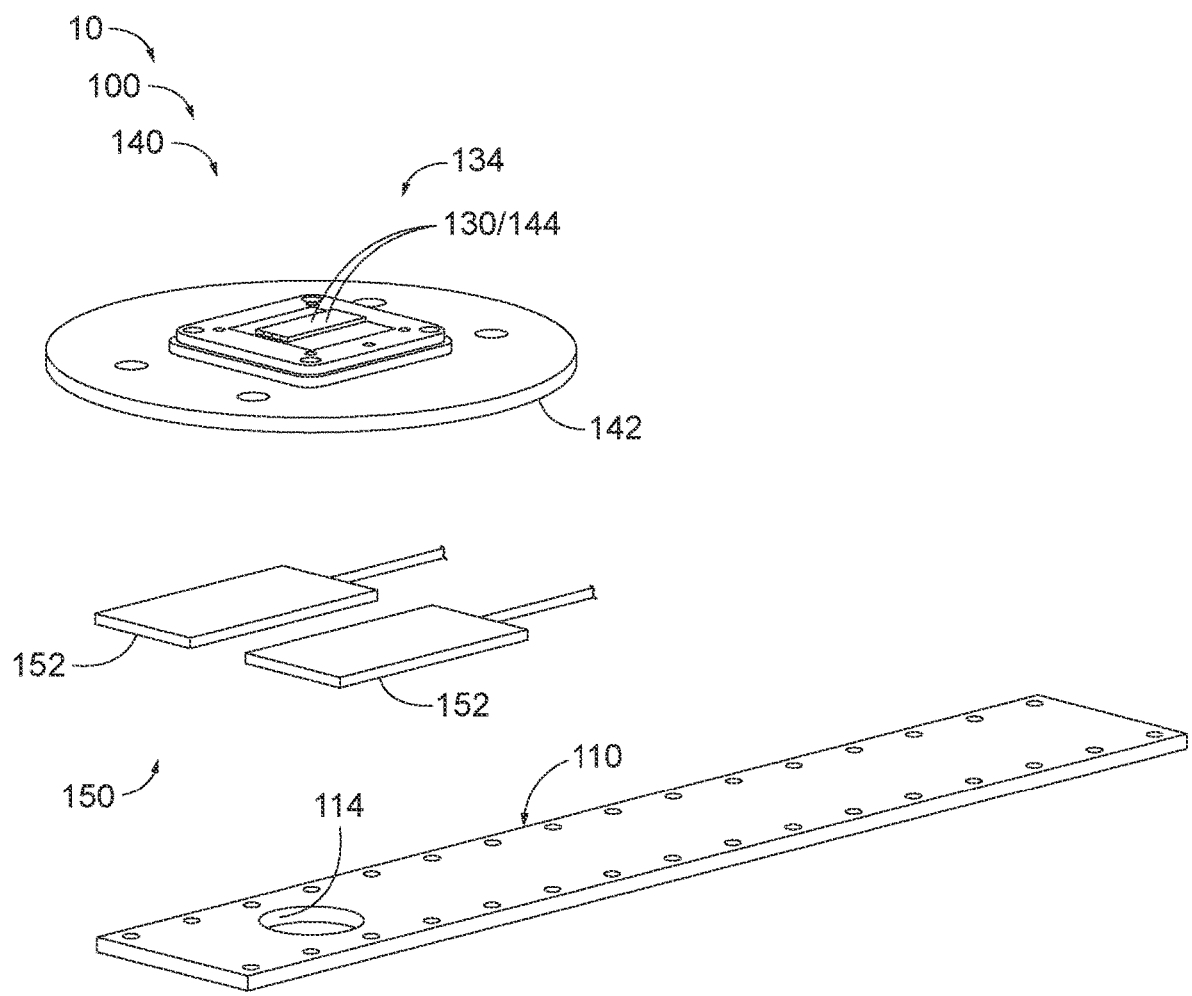
FIG. 3 is an exploded view of the support arm and thermally controlled probe head of FIG. 2.
Figure 4:
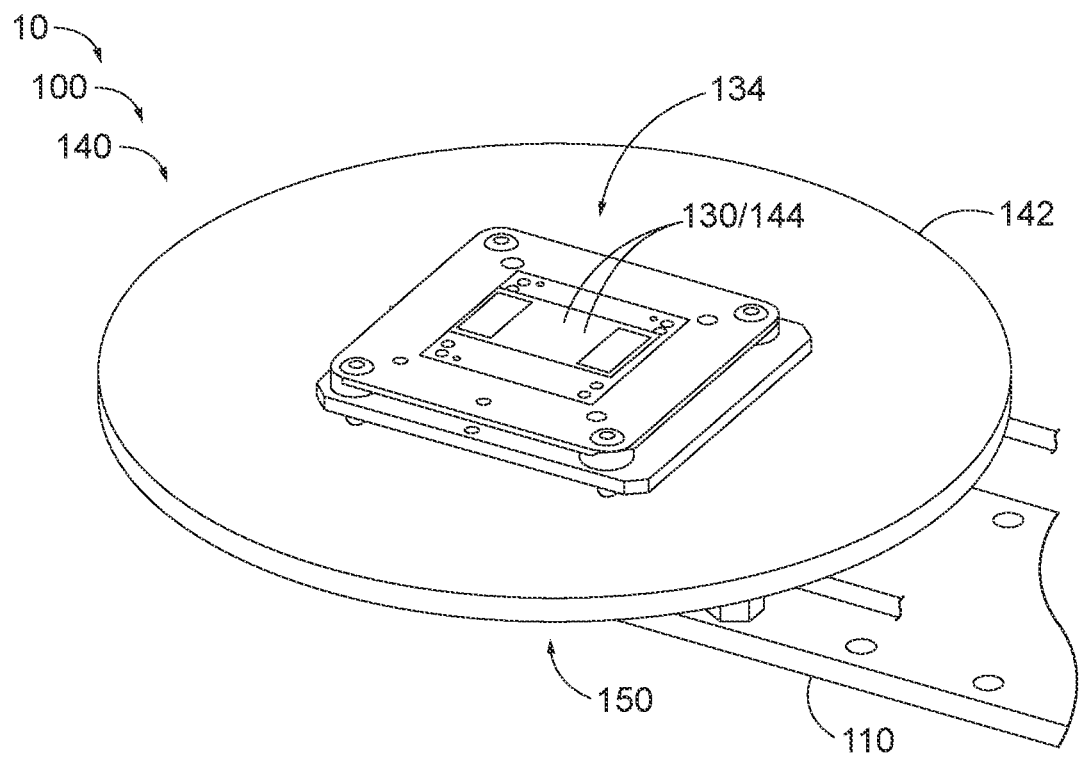
FIG. 4 is a fragmentary top side isometric view of an example of a thermally controlled probe head and a thermal control system that includes a heater plate according to the present disclosure.
Figure 5:
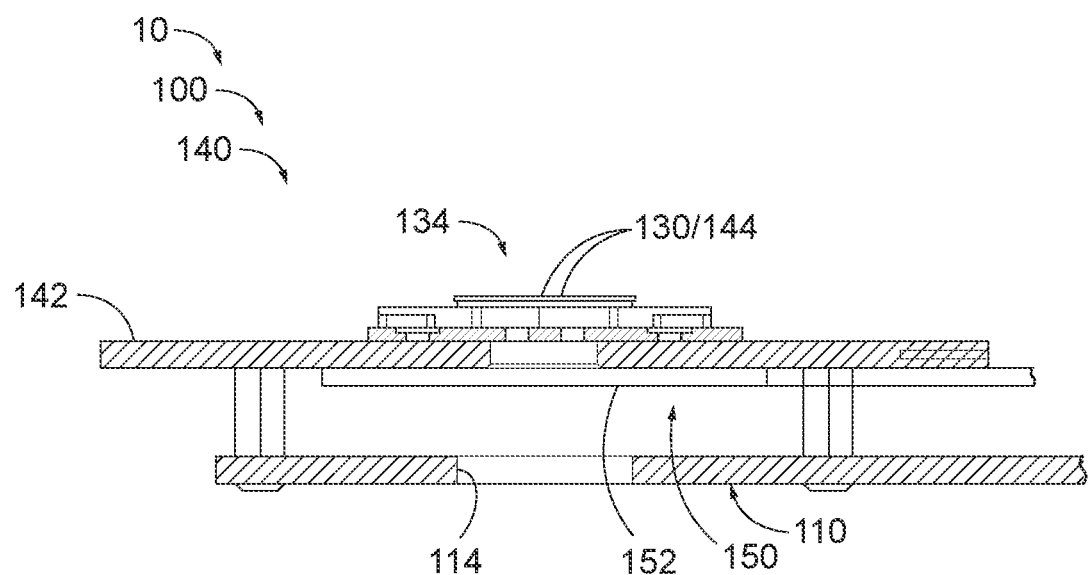
FIG. 5 is a fragmentary cross-sectional side elevation view of the thermally controlled probe head and thermal control system of FIG. 4.

FIGS. 2-5 are less schematic illustrations of a portion of probe assembly 100 in which thermal control system 150 includes heater plate 152 (visible in FIGS. 3-5). In particular, in the example of FIGS. 2-5, and as shown in FIGS. 3-5, heater plate 152 is positioned below base plate 142 and in direct thermal contact with the base plate. Thus, in such examples, heater plate 152 may be configured to heat base plate 142 at least partially via conductive heat transfer to at least partially control the base plate temperature, and the base plate may heat substrate 30 (not shown in FIGS. 2-5) via, or at least substantially via, convective and/or radiative heat transfer. In the example of FIGS. 2-5, probe assembly 100 includes a plurality of thermally controlled probes 144 supported by thermally controlled probe head 140. In particular, FIGS. 2-5 may be described as illustrating an example in which thermally controlled probe head 140 supports an array of thermally controlled probes 144.

As another example, and as additionally schematically illustrated in FIG. 1, thermal control system 150 may include a Peltier plate 154 that is configured to add and/or remove heat energy from substrate 30. In such examples, and as schematically illustrated in FIG. 1, Peltier plate 154 is configured to be spaced apart from substrate 30 during operative use of double-sided probe systems 10. In some examples, Peltier plate 154 is configured to be in thermal communication with base plate 142 and/or with substrate 30. In such examples, thermal control system 150 is configured to selectively vary a Peltier plate temperature of Peltier plate 154 to selectively and dynamically control the base plate temperature and/or the substrate temperature. In some such examples, the probe head temperature may include and/or be the Peltier plate temperature. In some examples, Peltier plate 154 may add heat energy to substrate 30 and/or remove heat energy from substrate 30 via conductive, convective, and/or radiative heat transfer. As a more specific example, Peltier plate 154 may be configured to add heat energy to base plate 142 and/or to remove heat energy from base plate 142 at least partially via conductive heat transfer, and the base plate in turn may be configured to add heat energy to substrate 30 and/or to remove heat energy from substrate 30 via convective and/or radiative heat transfer.

Peltier plate 154 may be configured to generate heat energy and/or to remove heat energy in any appropriate manner, such as via a thermoelectric effect and/or a Peltier effect responsive to an electric current. In some examples, Peltier plate 154 includes a heated region and a cooled region such that the Peltier plate generates a temperature differential between the heated region and the cooled region. In this manner, Peltier plate 154 may be utilized to selectively and dynamically increase and/or decrease the probe head temperature and/or the base plate temperature to control the substrate temperature. For example, Peltier plate 154 may be utilized to selectively increase the probe head temperature and/or the base plate temperature when the heated region is in thermal communication with thermally controlled probe head 140 and/or with base plate 142. In such examples, the heated region may be described as being in thermal communication with substrate 30, such as via base plate 142. Alternatively, Peltier plate 154 may be utilized to selectively decrease the probe head temperature and/or the base plate temperature when the cooled region is in thermal communication with thermally controlled probe head 140 and/or with base plate 142. In such examples, the cooled region may be described as being in thermal communication with substrate 30, such as via base plate 142. In some such examples, the heated region includes and/or is a heat sink that is configured to dissipate heat energy away from thermally controlled probe head 140.

Figure 6:
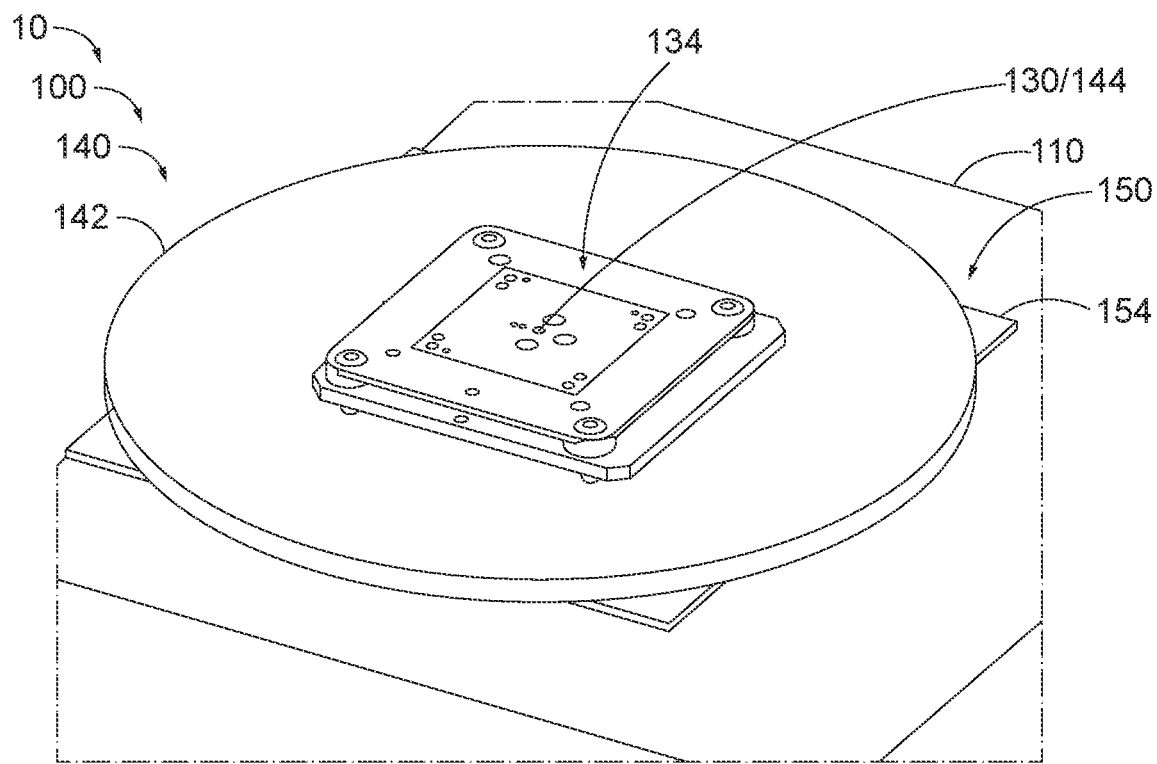
FIG. 6 is a fragmentary top side isometric view of an example of a thermally controlled probe head and a thermal control system that includes a Peltier plate according to the present disclosure.
Figure 7:
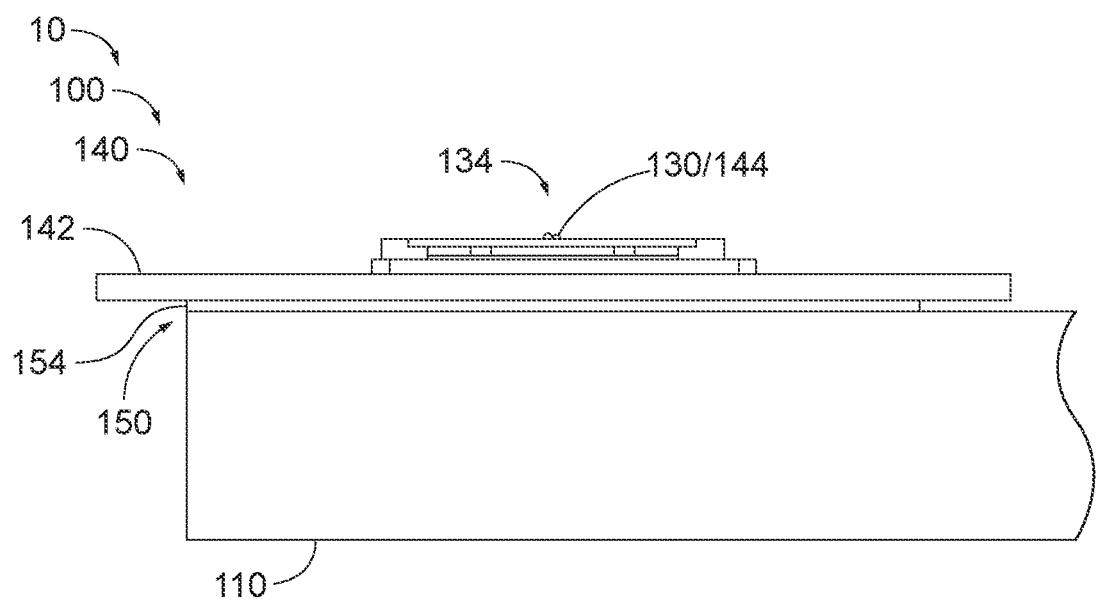
FIG. 7 is a fragmentary side elevation view of the thermally controlled probe head and thermal control system of FIG. 6.

FIGS. 6-7 are less schematic illustrations of a portion of probe assembly 100 in which thermal control system 150 includes Peltier plate 154. In particular, in the example of FIGS. 6-7, Peltier plate 154 is positioned below base plate 142 and in direct thermal contact with the base plate. Thus, in such examples, Peltier plate 154 may be configured to heat base plate 142 at least partially via conductive heat transfer to at least partially control the base plate temperature, and the base plate may heat substrate 30 (not shown in FIGS. 6-7) via convective and/or radiative heat transfer.

As yet another example, and as further schematically illustrated in FIG. 1, thermal control system 150 may include a fluid conduit 156 that is configured to convey a thermal fluid 158 toward and/or to thermally controlled probe head 140, base plate 142, and/or substrate 30. Specifically, in such examples, fluid conduit 156 is configured to convey thermal fluid 158 into thermal communication with thermally controlled probe head 140, with base plate 142, and/or with substrate 30. In some examples, thermal fluid 158 may operate to facilitate and/or enhance thermal communication, such as convective thermal communication, between base plate 142 and substrate 30. For example, in examples in which thermal control system 150 includes heater plate 152 and/or Peltier plate 154 in thermal communication with base plate 142, thermal fluid 158 may facilitate thermal communication between base plate 142 and substrate 30 such that thermal control system 150 brings the substrate temperature to a target temperature (such as the base plate temperature) more quickly and/or with more precision. In such examples, thermal fluid 158 also may be described as facilitating convective heat transfer between heater plate 152 and substrate 30, and/or between Peltier plate 154 and substrate 30.

Additionally or alternatively, thermal control system 150 may be configured to selectively vary a thermal fluid temperature of thermal fluid 158 and/or a thermal fluid flow rate of thermal fluid 158 through fluid conduit 156 to facilitate selectively and dynamically controlling the probe head temperature and/or the substrate temperature. In some examples, and as schematically illustrated in FIG. 1, thermal control system 150 additionally includes a thermal fluid supply source 160 that is configured to supply thermal fluid 158 to fluid conduit 156 at a controlled thermal fluid temperature and/or at a controlled thermal fluid flow rate. Thermal fluid 158 may include and/or be of a variety of fluids that are operable to convey heat energy, examples of which include a gas, a pressurized gas, air, nitrogen, a noble gas, and/or argon.

Figure 8:
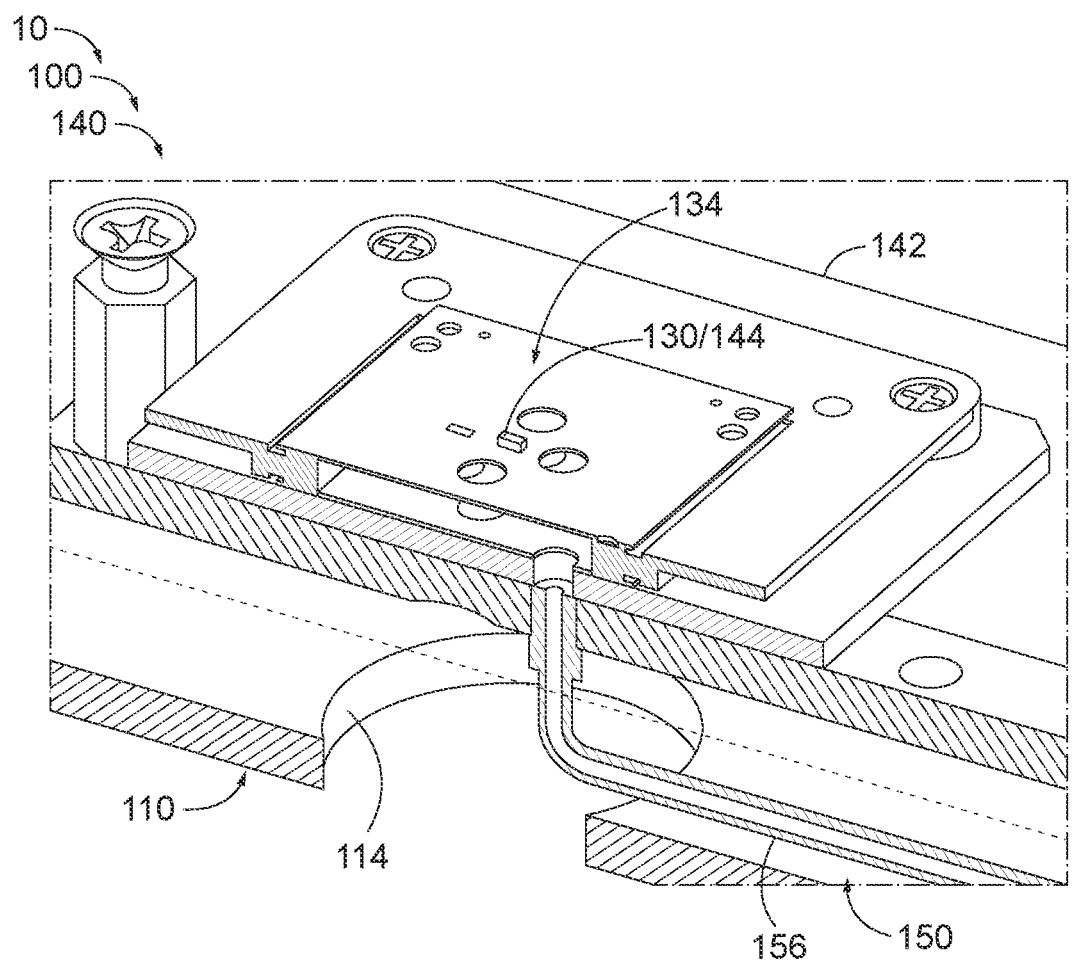
FIG. 8 is a fragmentary top side isometric view of an example of a thermally controlled probe head and a thermal control system that includes a fluid conduit according to the present disclosure.
Figure 9:
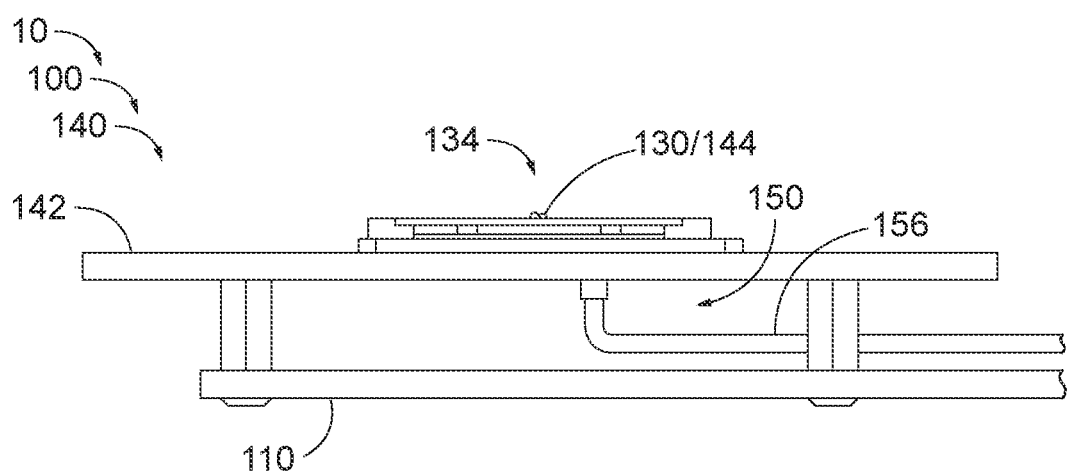
FIG. 9 is a fragmentary side elevation view of the thermally controlled probe head and thermal control system of FIG. 8.

FIGS. 8-9 are less schematic illustrations of a portion of probe assembly 100 in which thermal control system 150 includes fluid conduit 156. In particular, in the example of FIGS. 6-7, fluid conduit 156 is positioned to direct thermal fluid 158 to flow directly onto base plate 142, such as to at least partially control the base plate temperature via selective variation of the thermal fluid temperature and/or the thermal fluid flow rate.

In some examples, and as schematically illustrated in FIG. 1, thermal control system 150 includes a controller 180 that is programmed to at least partially control operation of double-sided probe system 10 and/or thermal control system 150. More specifically, in some examples, and as schematically illustrated in FIG. 1, controller 180 is programmed to generate a thermal control signal 182 that is configured to at least partially control operation of thermal control system 150. In such examples, and as schematically illustrated in FIG. 1, controller 180 may be programmed to transmit thermal control signal 182 to heater plate 152, to Peltier plate 154, and/or to thermal fluid supply source 160. As more specific examples, controller 180 may be programmed to at least partially control the heater plate temperature, the Peltier plate temperature, the thermal fluid temperature, and/or the thermal fluid flow rate with thermal control signal 182.

Controller 180 may include and/or be any suitable device or devices that are programmed and/or configured to perform the functions of the controller discussed herein. For example, controller 180 may include one or more of an electronic controller, a dedicated controller, a special-purpose controller, a personal computer, a special-purpose computer, a display device, a logic device, a memory device, and/or a memory device having non-transitory computer readable media suitable for storing computer-executable instructions for implementing aspects of systems and/or methods according to the present disclosure.

In some examples, controller 180 is programmed to generate thermal control signal 182 at least partially based upon a measured temperature of a component of double-sided probe system 10 and/or of substrate 30. In some such examples, and as schematically illustrated in FIG. 1, thermal control system 150 includes one or more temperature sensors 170, each of which is configured to measure a respective probe system temperature of at least a portion and/or region of double-sided probe system 10 and/or of substrate 30. As examples, temperature sensor(s) 170 may be configured and/or positioned such that each respective probe system temperature includes and/or is the substrate temperature, the probe head temperature, the base plate temperature, the heater plate temperature, the Peltier plate temperature, and/or the thermal fluid temperature. In such examples, and as schematically illustrated in FIG. 1, each temperature sensor 170 is configured to generate and transmit a respective temperature signal 172 that represents the respective probe system temperature. More specifically, in some such examples, each temperature sensor 170 is configured to transmit the respective temperature signal 172 to controller 180, and the controller is programmed to generate the thermal control signal at least partially based upon the respective temperature signal 172 of one or more temperature sensors. Each temperature sensor 170 may include and/or be any of a variety of devices that are operable to measure the respective probe system temperature, examples of which include a thermometer, a thermocouple, a thermistor, an infrared temperature sensor, a contact temperature sensor, and a non-contact temperature sensor.

In some examples, and as schematically illustrated in FIG. 1, double-sided probe system 10 includes one or more electrical conductors 112 configured to electrically interconnect components of double-sided probe system 10, of probe assembly 100, and/or of thermal control system 150. In some such examples, electrical conductor 112 may be configured to provide electrical power to one or more components of thermal control system 150, such as heater plate 152 and/or Peltier plate 154. Additionally or alternatively, and as schematically illustrated in FIG. 1, electrical conductor 112 may be configured to convey temperature signal(s) 172 from temperature sensor(s) 170 to controller 180. Additionally or alternatively, and as further schematically illustrated in FIG. 1, electrical conductor 112 may be configured to convey thermal control signal 182 from controller 180 to one or more components of thermal control system 150, such as heater plate 152, Peltier plate 154, and/or thermal fluid supply source 160.

In some examples, and as schematically illustrated in FIG. 1, probe assembly 100 includes at least one imaging device 190 that is configured to generate an optical image of at least a portion and/or region of double-sided probe system 10 and/or of substrate 30. As examples, each imaging device 190 may be configured to generate an optical image of first substrate side 32, of a portion of probe assembly 100 that contacts first substrate side 32, of second substrate side 34, and/or of a portion of probe assembly 100 that contacts second substrate side 34. In some examples, imaging devices 190 may be configured to facilitate alignment of each probe 130 with a corresponding DUT 40 and/or a corresponding testing location 42 thereof. Additionally or alternatively, imaging devices 190 may be configured to collect electromagnetic radiation and/or light emitted by substrate 30 and/or DUT(s) 40, such as to evaluate and/or characterize a performance of the DUT(s). Accordingly, in some examples, and as schematically illustrated in FIG. 1, probe(s) 130 of probe assembly 100 may include imaging device 190. Stated differently, in some examples, each imaging device 190 may be described as an example of probe 130 that is configured to receive light from at least one corresponding testing location 42 in the form of a region of double-sided probe system 10 and/or substrate 30 that is within a field of view of the imaging device. In such examples, each imaging device 190 may be described as being configured to receive resultant signal 54 in the form of the electromagnetic radiation and/or light that is emitted from the corresponding testing location 42.

As used herein, the terms "alignment" or "aligned," as used to describe a relative orientation of a probe 130 (and/or a portion thereof) and a corresponding DUT 40 (and/or a portion thereof), generally refers to a configuration in which the probe is at least substantially vertically aligned with the corresponding DUT, at least substantially horizontally aligned with the corresponding DUT, at least substantially aligned with a corresponding testing location 42 of the corresponding DUT, and/or positioned such that a corresponding probe 130 contacts the corresponding testing location.

As used herein, directional terms such as "horizontal," "vertical," and the like generally refer to a configuration in which substrate 30 extends at least substantially parallel to the ground and in which each probe 130 is positioned vertically above or vertically below the substrate. For example, FIG. 1 may be described as schematically illustrating a configuration in which substrate 30 extends in a horizontal direction. However, such configurations are not required, and it is additionally within the scope of the present disclosure that components of double-sided probe systems 10 may have any suitable orientation relative to the ground.

In some examples, and as schematically illustrated in FIG. 1, at least one imaging device 190 of probe assembly 100 may include and/or be a thermally controlled probe head imaging device 192. Specifically, in such examples, thermally controlled probe head imaging device 192 is configured to generate an optical image of at least a portion and/or region of thermally controlled probe head 140. In some such examples, and as schematically illustrated in FIG. 1, thermally controlled probe head imaging device 192 is configured to generate an optical image of a portion of thermally controlled probe head 140 that is configured to interface with second substrate side 34. Additionally or alternatively, and as schematically illustrated in FIG. 1, at least one imaging device 190 of probe assembly 100 may include and/or be a substrate imaging device 194 that is configured to generate an optical image of at least a portion and/or region of substrate 30, such as first substrate side 32, one or more DUTs 40, and/or one or more testing locations 42.

Each imaging device 190, such as thermally controlled probe head imaging device 192 and/or substrate imaging device 194, may be configured to receive light for generating an optical image along any appropriate direction, such as a direction that is at least substantially parallel to the Z-direction that is illustrated in FIG. 1. Each imaging device 190 may include and/or be any of a variety of structures and/or devices that are adapted, configured, designed, and/or constructed to generate one or more optical images of probe assembly 100 and/or of substrate 30. As examples, each imaging device 190 may include and/or be one or more of a microscope, a microscope that includes an eyepiece, a microscope that does not include an eyepiece, a camera, a charge-coupled device, an imaging sensor, a solid-state imaging device, a C-MOS imaging device, and/or a lens.

Thermally controlled probe head 140 may be operatively supported relative to chuck 20 and/or to substrate 30 via any appropriate structure and/or mechanism. In some examples, as schematically illustrated in FIG. 1 and as less schematically illustrated in FIGS. 2-9, probe assembly 100 includes a support arm 110 that operatively supports thermally controlled probe head 140 relative to chuck 20 (shown in FIG. 1) and/or relative to substrate 30 (shown in FIG. 1). Support arm 110 may extend along any appropriate direction, such as a direction that is at least substantially parallel to each of first substrate side 32 and second substrate side 34. In such examples, support arm 110 may be described as extending at least substantially horizontally. In some examples, and as schematically illustrated in FIG. 1, support arm 110 extends at least partially exterior of chuck 20, such as exterior of chuck internal volume 28.

In some examples, support arm 110 supports one or more components of probe assembly 100 and/or of thermal control system 150 in addition to thermally controlled probe head 140. As an example, as schematically illustrated in FIG. 1 and less schematically illustrated in FIG. 2, support arm 110 may support thermally controlled probe head imaging device 192 relative to chuck 20 (shown in FIG. 1) and/or substrate 30 (shown in FIG. 1). In some such examples, as schematically illustrated in FIG. 1 and less schematically illustrated at least in FIGS. 3 and 5, support arm 110 includes a support arm aperture 114 that permits light to travel through the support arm, such as from base plate 142 to thermally controlled probe head imaging device 192. In this manner, in such examples, support arm aperture 114 may be described as enabling thermally controlled probe head imaging device 192 to view and/or to optically access a portion of probe assembly 100 and/or of substrate 30 that is positioned on an opposite side of support arm 110 relative to the thermally controlled probe head imaging device. Additionally or alternatively, in some examples, and as schematically illustrated in FIG. 1, support arm 110 at least partially supports electrical conductor(s) 112.

In some examples, as further schematically illustrated in FIG. 1 and less schematically illustrated in FIG. 2, probe assembly 100 includes a positioner stage 120 that operatively supports support arm 110, such as relative to chuck 20 (shown in FIG. 1) and/or substrate 30 (shown in FIG. 1). In particular, in some such examples, and as schematically illustrated in FIG. 1, support arm 110 is operatively coupled to positioner stage 120 and extends away from positioner stage 120. In some such examples, and as schematically illustrated in FIG. 1, positioner stage 120 is positioned at least partially exterior of chuck 20 and/or of chuck internal volume 28, and support arm 110 extends away from positioner stage 120 and into the chuck internal volume.

In such examples, positioner stage 120 is configured to selectively move support arm 110 relative to chuck 20 and/or relative to substrate 30 to selectively position thermally controlled probe head 140 relative to chuck 20 and/or substrate 30. Positioner stage 120 may be configured to move support arm 110 and/or thermally controlled probe head 140 in any of a variety of manners, such as by selectively translating and/or selectively rotating thermally controlled probe head 140 relative to chuck 20 and/or substrate 30. In this manner, positioner stage 120 may be utilized to operatively translate each thermally controlled probe 144 throughout a probe range-of-motion, thereby operatively translating each thermally controlled probe 144 relative to chuck 20, substrate 30, and/or DUT(s) 40.

In some examples, positioner stage 120 may be utilized to operatively align one or more thermally controlled probes 144 with specific, target, and/or desired locations relative to and/or on substrate 30 and/or DUT(s) 40, such as to permit communication between the thermally controlled probes and the DUT(s). Positioner stage 120 may be configured to selectively translate thermally controlled probe head 140 relative to chuck 20 and/or substrate 30 in any of a plurality of different, separate, distinct, perpendicular, and/or orthogonal directions, such as the X-, Y-, and/or Z-directions that are illustrated in FIG. 1. Additionally or alternatively, positioner stage 120 may be configured to selectively rotate thermally controlled probe head 140 relative to chuck 20 and/or substrate 30 about any of a plurality of different, separate, distinct, perpendicular, and/or orthogonal directions, such as the X-, Y-, and/or Z-directions that are illustrated in FIG. 1. In the example of FIG. 1, the X- and Y-directions may be parallel, or at least substantially parallel, to chuck support surface 22, to first substrate surface 32, and/or to second substrate surface 34, while the Z-direction may be perpendicular, or at least substantially perpendicular, to chuck support surface 22, to first substrate surface 32, and/or to second substrate surface 34. However, this specific configuration is not required.

Positioner stage 120 may include and/or be any of a variety of structures that may operatively support thermally controlled probe head 140, such as via support arm 110, and/or that may be configured to operatively translate each thermally controlled probe 144 throughout the probe range-of-motion, such as may extend in three orthogonal, or at least substantially orthogonal, axes, such as the X-, Y-, and Z-axes of FIG. 1. As examples, positioner stage 120 may include one or more translation stages, lead screws, ball screws, rack and pinion assemblies, motors, stepper motors, electrical actuators, mechanical actuators, piezoelectric actuators, micrometers, and/or manual actuators. Positioner stage 120 may be a manually actuated stage and/or an automated, or electrically actuated, stage. In some examples, positioner stage 120 may be described as including support arm 110.

Figure 10:
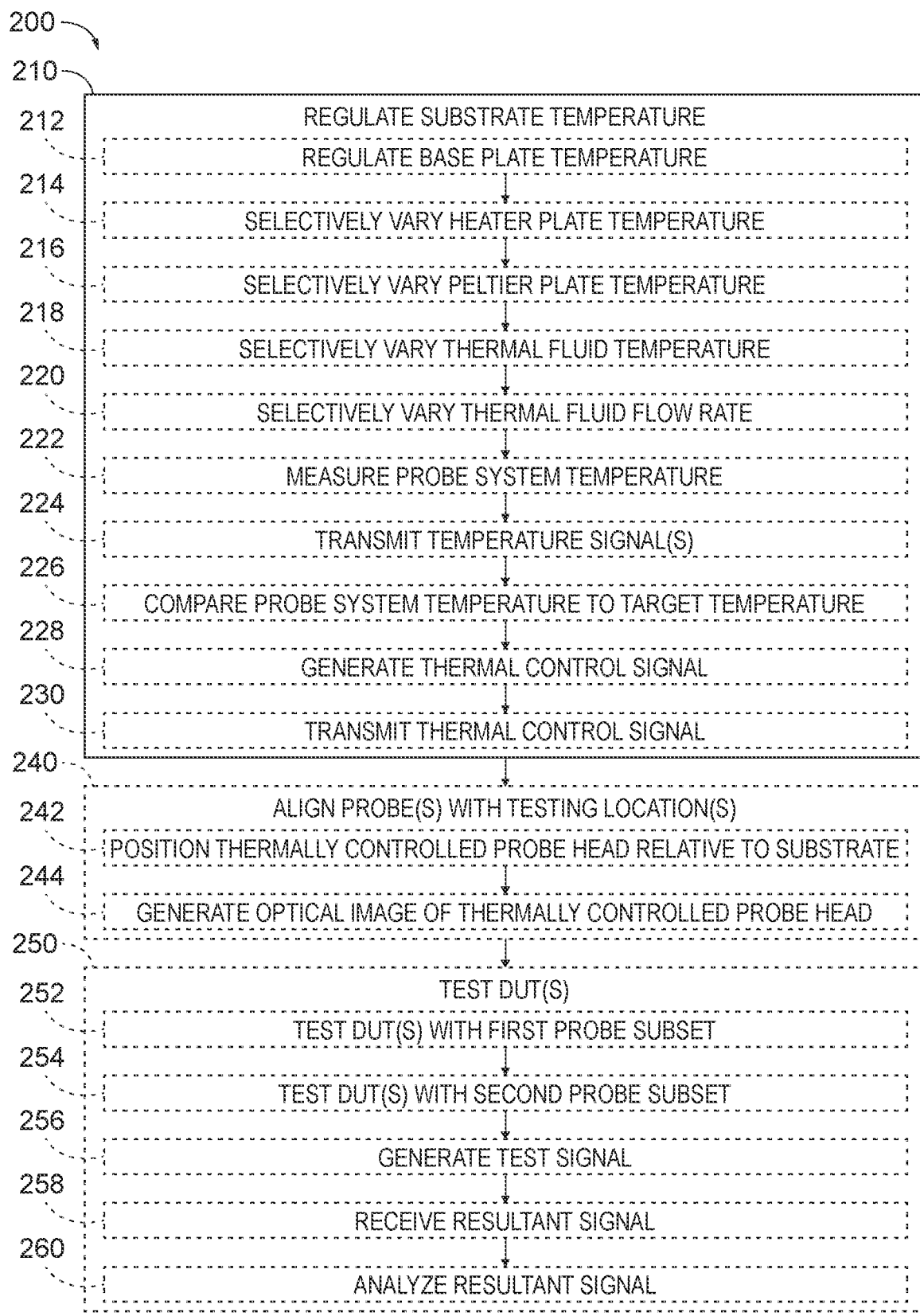
FIG. 10 is a flowchart depicting examples of methods of operating double-sided probe systems according to the present disclosure.

FIG. 10 is a flowchart depicting methods 200, according to the present disclosure, of operating a double-sided probe system, such as double-sided probe system 10 described herein. Specifically, and as shown in FIG. 10, methods 200 include regulating, at 210, a substrate temperature of a substrate that includes one or more DUTs utilizing a thermal control system of the double-sided probe system. Examples of substrates, DUTs, and/or thermal control systems that may be utilized in conjunction with methods 200 are described herein with reference to substrate 30, DUT(s) 40, and/or thermal control system 150, respectively.

The regulating the substrate temperature at 210 may be performed utilizing any of a variety of components described herein with reference to double-sided probe system 10. As examples, and as shown in FIG. 10, the regulating the substrate temperature at 210 may include regulating, at 212, a base plate temperature of a base plate; selectively varying, at 214, a heater plate temperature of a heater plate; selectively varying, at 216, a Peltier plate temperature of a Peltier plate; selectively varying, at 218, a thermal fluid temperature of a thermal fluid; and/or selectively varying, at 220, a thermal fluid flow rate of the thermal fluid. Examples of base plates, heater plates, Peltier plates, and/or thermal fluids that may be utilized in conjunction with methods 200 are described herein with reference to base plate 142, heater plate 152, Peltier plate 154, and/or thermal fluid 158, respectively.

In some examples, and as described herein with reference to thermal control system 150, the base plate is in thermal communication, such as conductive, convective, and/or radiative thermal communication, with the heater plate, the Peltier plate, and/or the thermal fluid. In such examples, the heater plate, the Peltier plate, and/or the thermal fluid may be described as regulating the substrate temperature at least partially by heating and/or cooling the base plate. Accordingly, in some such examples, the regulating the base plate temperature at 212 may be described as including the selectively varying the heater plate temperature at 214, the selectively varying the Peltier plate temperature at 216, the selectively varying the thermal fluid temperature at 218, and/or the selectively varying the thermal fluid flow rate at 220.

In some examples, the regulating the substrate temperature at 210 includes bringing the substrate temperature to a target temperature and/or maintaining the substrate temperature at or near the target temperature. In some such examples, and as shown in FIG. 10, the regulating the substrate temperature at 210 includes measuring, at 222 and with each of one or more temperature sensors, a respective probe system temperature of at least a portion and/or region of the double-sided probe system. Examples of temperature sensors that may be utilized in conjunction with methods 200 are described herein with reference to temperature sensor 170. In such examples, the probe system temperature may include and/or be a temperature of any suitable component of the double-sided probe system and/or of the substrate, examples of which include the heater plate temperature, the Peltier plate temperature, the thermal fluid temperature, the base plate temperature, and/or the substrate temperature as discussed herein.

In some examples, and as shown in FIG. 10, the regulating the substrate temperature at 210 additionally includes transmitting, at 224 and with each temperature sensor, a respective temperature signal (such as temperature signal 172 as described herein), such as to a controller of the double-sided probe system (such as controller 180 as described herein). In such examples, and as shown in FIG. 10, the regulating the substrate temperature at 210 additionally may include comparing, at 226 and with the controller, the probe system temperature to the target temperature and generating, at 228 and with the controller, a thermal control signal, such as thermal control signal 182 as described herein. In such examples, and as further shown in FIG. 10, the regulating the substrate temperature at 210 additionally may include transmitting, at 230 and with the controller, the thermal control signal to another component of the thermal control system, such as to the heater plate, to the Peltier plate, and/or a thermal fluid supply source, such as thermal fluid supply source 160 described herein.

In some examples, the generating the thermal control signal at 228 is at least partially based upon the comparing the probe system temperature to the target temperature at 226. For example, if the comparing the probe system temperature to the target temperature at 226 results in an indication that the probe system temperature is lower than the target temperature, the generating the thermal control signal at 228 may include generating a thermal control signal that operates to increase the probe system temperature with the thermal control system. In some more specific examples, the generating the thermal control signal at 228 may include utilizing a feedback routine, such as a proportional-integral-derivative (PID) feedback loop, to generate the thermal control signal based upon the probe system temperature and the target temperature.

In some examples, and as shown in FIG. 10, methods 200 additionally include testing, at 250 and with a probe assembly of the double-sided probe system, one or more DUTs of the substrate. More specifically, in some such examples, the testing the DUT(s) at 250 is performed concurrently with the regulating the substrate temperature at 210. Examples of probe assemblies that may be utilized in conjunction with methods 200 are described herein with reference to probe assembly 100.

In some examples, and as shown in FIG. 10, the testing the DUT(s) at 250 includes testing, at 252, at least a subset of the DUT(s) with a first probe subset and testing, at 254, at least a subset of the DUT(s) with a second probe subset. Examples of first probe subsets and second probe subsets are described herein with reference to first probe subset 132 and second probe subset 134, respectively. In some such examples, the testing with the first probe subset at 252 and the testing with the second probe subset at 254 are performed concurrently and/or while the substrate remains at least substantially fixed relative to a chuck, such as chuck 20.

In some examples, and as discussed herein, the testing with the second probe subset at 254 may include utilizing the second probe subset to provide a test signal (such as test signal 52 described herein) to one or more DUTs via a second substrate side (such as second substrate side 34 described herein). In some such examples, the testing with the first probe subset at 252 may include utilizing the first probe subset to receive a resultant signal (such as resultant signal 54 described herein) from one or more DUTs via a first substrate side (such as first substrate side 32 described herein). As a more specific example, the testing with the second probe subset at 254 may include providing the test signal in the form of an electrical signal, and the testing with the first probe subset at 252 may include receiving the resultant signal in the form of an optical signal, such as with an imaging device such as imaging device 190 and/or substrate imaging device 194 as described herein. Additionally or alternatively, in some examples, and as shown in FIG. 10, the testing the DUT(s) at 250 may include generating, at 256, the test signal; receiving, at 258, the resultant signal; and/or analyzing, at 260, the resultant signal. In such examples, the generating the test signal at 256, the receiving the resultant signal at 258, and/or the analyzing the resultant signal at 260 each may be performed with a signal generation and analysis assembly. Examples of signal generation and analysis assemblies that may be utilized in conjunction with methods 200 are described herein with reference to signal generation and analysis assembly 50.

In some examples, the testing the DUT(s) at 250 is at least partially performed with one or more probes, such as one or more thermally controlled probes. Examples of probes and/or thermally controlled probes that may be utilized in conjunction with methods 200 are described herein with reference to probes 130 and/or thermally controlled probes 144, respectively. In some such examples, and as shown in FIG. 10, methods 200 additionally include, prior to the testing the DUT(s) at 250, aligning, at 240, the one or more probes and/or the one or more thermally controlled probes with respective testing locations. The aligning the probe(s) at 240 may be performed in any of a variety of manners and with any of a variety of mechanisms. In some examples, and as shown in FIG. 10, the aligning the probe(s) at 240 includes positioning, at 242 and with a positioner stage, a thermally controlled probe head that includes one or more probes relative to the substrate. Additionally or alternatively, in some such examples, and as shown in FIG. 10, the aligning the probe(s) at 240 includes generating, at 244 and with a thermally controlled probe head imaging device, an optical image of at least a portion and/or region of the thermally controlled probe head. More specifically, in such examples, the generating the optical image at 244 may include utilizing the thermally controlled probe head imaging device to determine a location and/or an orientation of the probe(s) relative to the substrate, the DUT(s), and/or the testing location(s) in order to establish and/or confirm alignment between the probe(s) and the testing location(s). Examples of testing locations, positioner stages, and/or thermally controlled probe heads that may be utilized in conjunction with methods 200 are described herein with reference to testing locations 42, positioner stages 120, and/or thermally controlled probe heads 140, respectively.

As used herein, the term "and/or" placed between a first entity and a second entity means one of (1) the first entity, (2) the second entity, and (3) the first entity and the second entity. Multiple entities listed with "and/or" should be construed in the same manner, i.e., "one or more" of the entities so conjoined. Other entities may optionally be present other than the entities specifically identified by the "and/or" clause, whether related or unrelated to those entities specifically identified. Thus, as a non-limiting example, a reference to "A and/or B," when used in conjunction with open-ended language such as "comprising" may refer, in one embodiment, to A only (optionally including entities other than B); in another embodiment, to B only (optionally including entities other than A); in yet another embodiment, to both A and B (optionally including other entities). These entities may refer to elements, actions, structures, steps, operations, values, and the like.

As used herein, the phrase "at least one," in reference to a list of one or more entities should be understood to mean at least one entity selected from any one or more of the entity in the list of entities, but not necessarily including at least one of each and every entity specifically listed within the list of entities and not excluding any combinations of entities in the list of entities. This definition also allows that entities may optionally be present other than the entities specifically identified within the list of entities to which the phrase "at least one" refers, whether related or unrelated to those entities specifically identified. Thus, as a non-limiting example, "at least one of A and B" (or, equivalently, "at least one of A or B," or, equivalently "at least one of A and/or B") may refer, in one embodiment, to at least one, optionally including more than one, A, with no B present (and optionally including entities other than B); in another embodiment, to at least one, optionally including more than one, B, with no A present (and optionally including entities other than A); in yet another embodiment, to at least one, optionally including more than one, A, and at least one, optionally including more than one, B (and optionally including other entities). In other words, the phrases "at least one," "one or more," and "and/or" are open-ended expressions that are both conjunctive and disjunctive in operation. For example, each of the expressions "at least one of A, B and C," "at least one of A, B, or C," "one or more of A, B, and C," "one or more of A, B, or C" and "A, B, and/or C" may mean A alone, B alone, C alone, A and B together, A and C together, B and C together, A, B and C together, and optionally any of the above in combination with at least one other entity.

As used herein, the phrase "at least substantially," when modifying a degree or relationship, includes not only the recited "substantial" degree or relationship, but also the full extent of the recited degree or relationship. A substantial amount of a recited degree or relationship may include at least 75% of the recited degree or relationship. For example, a first direction that is at least substantially parallel to a second direction includes a first direction that is within an angular deviation of 22.5° relative to the second direction and also includes a first direction that is identical to the second direction.

In the event that any patents, patent applications, or other references are incorporated by reference herein and (1) define a term in a manner that is inconsistent with and/or (2) are otherwise inconsistent with, either the non-incorporated portion of the present disclosure or any of the other incorporated references, the non-incorporated portion of the present disclosure shall control, and the term or incorporated disclosure therein shall only control with respect to the reference in which the term is defined and/or the incorporated disclosure was present originally.

As used herein the terms "adapted" and "configured" mean that the element, component, or other subject matter is designed and/or intended to perform a given function. Thus, the use of the terms "adapted" and "configured" should not be construed to mean that a given element, component, or other subject matter is simply "capable of" performing a given function but that the element, component, and/or other subject matter is specifically selected, created, implemented, utilized, programmed, and/or designed for the purpose of performing the function. It is also within the scope of the present disclosure that elements, components, and/or other recited subject matter that is recited as being adapted to perform a particular function may additionally or alternatively be described as being configured to perform that function, and vice versa.

As used herein, the terms "selective" and "selectively," when modifying an action, movement, configuration, or other activity of one or more components or characteristics of an apparatus, mean that the specific action, movement, configuration, or other activity is a direct or indirect result of one or more dynamic processes, as described herein. The terms "selective" and "selectively" thus may characterize an activity that is a direct or indirect result of user manipulation of an aspect of, or one or more components of, the apparatus, or may characterize a process that occurs automatically, such as via the mechanisms disclosed herein.

As used herein, the phrase, "for example," the phrase, "as an example," and/or simply the term "example," when used with reference to one or more components, features, details, structures, and/or embodiments according to the present disclosure, are intended to convey that the described component, feature, detail, structure, and/or embodiment is an illustrative, non-exclusive example of components, features, details, structures, and/or embodiments according to the present disclosure. Thus, the described component, feature, detail, structure, and/or embodiment is not intended to be limiting, required, or exclusive/exhaustive; and other components, features, details, structures, and/or embodiments, including structurally and/or functionally similar and/or equivalent components, features, details, structures, and/or embodiments, are also within the scope of the present disclosure.

In the present disclosure, several of the illustrative, non-exclusive examples have been discussed and/or presented in the context of flow diagrams, or flow charts, in which the methods are shown and described as a series of blocks, or steps. Unless specifically set forth in the accompanying description, it is within the scope of the present disclosure that the order of the blocks may vary from the illustrated order in the flow diagram, including with two or more of the blocks (or steps) occurring in a different order, concurrently, and/or repeatedly. It is also within the scope of the present disclosure that the blocks, or steps, may be implemented as logic, which also may be described as implementing the blocks, or steps, as logics. In some applications, the blocks, or steps, may represent expressions and/or actions to be performed by functionally equivalent circuits or other logic devices. The illustrated blocks may, but are not required to, represent executable instructions that cause a computer, processor, and/or other logic device to respond, to perform an action, to change states, to generate an output or display, and/or to make decisions.

The various disclosed elements of apparatuses and systems and steps of methods disclosed herein are not required to all apparatuses, systems, and methods according to the present disclosure, and the present disclosure includes all novel and non-obvious combinations and subcombinations of the various elements and steps disclosed herein. Moreover, one or more of the various elements and steps disclosed herein may define independent inventive subject matter that is separate and apart from the whole of a disclosed apparatus, system, or method. Accordingly, such inventive subject matter is not required to be associated with the specific apparatuses, systems, and methods that are expressly disclosed herein and such inventive subject matter may find utility in apparatuses, systems, and/or methods that are not expressly disclosed herein.

Illustrative, non-exclusive examples of double-sided probe systems according to the present disclosure are presented in the following enumerated paragraphs:

A1. A temperature-controlled, double-sided probe system, comprising:
a probe assembly configured to test one or more devices under test (DUTs) of a substrate, wherein the probe assembly includes a thermal control system configured to at least partially control a substrate temperature of the substrate while the probe assembly tests the one or more DUTs; and
a chuck configured to support the substrate, wherein the chuck is configured to support the substrate such that the probe assembly has access to each of a first substrate side of the substrate and a second substrate side of the substrate, which is opposite the first substrate side, while the substrate is operatively supported by the chuck.

A2. The double-sided probe system of paragraph A1, wherein the chuck is configured to support the substrate such that the probe assembly is operable to test each of the first substrate side and the second substrate side.

A3. The double-sided probe system of any of paragraphs A1-A2, wherein, during operative use of the double-sided probe system, the probe assembly is configured to one or both of:
(i) transmit a test signal to one or both of the first substrate side and the second substrate side; and
(ii) receive a resultant signal from one or both of the first substrate side and the second substrate side.

A4. The double-sided probe system of paragraph A3, wherein the resultant signal is at least partially based upon the test signal.

A5. The double-sided probe system of any of paragraphs A3-A4, wherein the probe assembly is configured to transmit the test signal to one of the first substrate side and the second substrate side; and wherein the probe assembly is configured to receive the resultant signal from the other of the first substrate side and the second substrate side.

A6. The double-sided probe system of any of paragraphs A1-A5, wherein the probe assembly is configured to one or both of access and interface with each of the first substrate side and the second substrate side concurrently during operative use of the double-sided probe system.

A7. The double-sided probe system of any of paragraphs A1-A6, wherein the probe assembly is configured to test one of the first substrate side and the second substrate side via an electrical connection, optionally by providing an electrical signal; and wherein the probe assembly is configured to test the other of the first substrate side and the second substrate side via an optical measurement, optionally by receiving an optical signal, and optionally by receiving an optical signal that corresponds to the electrical signal.

A8. The double-sided probe system of any of paragraphs A1-A7, wherein the chuck is configured to contact the substrate only along a peripheral region of the substrate during operative use of the double-sided probe system.

A9. The double-sided probe system of any of paragraphs A1-A8, wherein the chuck includes a chuck support surface that is configured to contact the second substrate side of the substrate, optionally a/the peripheral region of the second substrate side, to support the substrate.

A10. The double-sided probe system of any of paragraphs A1-A9, wherein the chuck includes a chuck open region; and wherein the probe assembly is configured to test one of the first substrate side or the second substrate side via the chuck open region.

A11. The double-sided probe system of paragraph A10, wherein a/the chuck support surface at least partially bounds the chuck open region such that, during operative use of the double-sided probe system, the probe assembly is configured to test the second substrate side of the substrate via the chuck open region.

A12. The double-sided probe system of any of paragraphs A10-A11, wherein the chuck open region includes, and optionally is, one or more of an aperture, a gap, a channel, and a hole.

A13. The double-sided probe system of any of paragraphs A1-A12, wherein the thermal control system is spaced apart from the chuck.

A14. The double-sided probe system of any of paragraphs A1-A13, wherein the thermal control system is not in direct mechanical communication with the chuck.

A15. The double-sided probe system of any of paragraphs A1-A14, wherein the thermal control system is not in indirect mechanical communication with the chuck.

A16. The double-sided probe system of any of paragraphs A1-A15, wherein the probe assembly includes a thermally controlled probe head configured to test at least one DUT of the one or more DUTs; optionally wherein the thermally controlled probe head includes at least a portion of the thermal control system; and optionally wherein the thermal control system is configured to at least partially control one or both of the substrate temperature and a probe head temperature of at least a portion and/or region of the thermally controlled probe head while the thermally controlled probe head tests the at least one DUT of the one or more DUTs.

A17. The double-sided probe system of any of paragraphs A1-A16, wherein the double-sided probe system is configured to bring the substrate to a maximum temperature that is one or more of at least 60 degrees Celsius, at least 70 degrees Celsius, at least 80 degrees Celsius, at least 90 degrees Celsius, at most 100 degrees Celsius, at most 85 degrees Celsius, at most 75 degrees Celsius, and at most 65 degrees Celsius.

A18. The double-sided probe system of any of paragraphs A1-A17, wherein the double-sided probe system is configured to maintain the substrate temperature at a temperature that differs from a target, or desired, temperature by one or more of at most 5 degrees Celsius, at most 3 degrees Celsius, at most 2 degrees Celsius, at most 1 degree Celsius, and at most 0.5 degrees Celsius.

A19. The double-sided probe system of any of paragraphs A1-A18, wherein the chuck includes one or more chuck walls and a chuck internal volume that is at least partially bounded by one or both of the one or more chuck walls and a/the chuck support surface; and wherein the thermally controlled probe head is positioned at least partially within the chuck internal volume during operative use of the double-sided probe system.

A20. The double-sided probe system of any of paragraphs A1-A19, wherein the probe assembly is configured to interface with one or more testing locations of the substrate, optionally wherein the one or more testing locations is a plurality of testing locations; wherein each DUT of the one or more DUTs includes at least one corresponding testing location of the one or more testing locations.

A21. The double-sided probe system of paragraph A20, wherein the one or more testing locations includes one or both of:

(i) a first testing location subset, each testing location of the first testing location subset being one or both of formed on the first substrate side and configured to be tested via the first substrate side; and (ii) a second testing location subset, each testing location of the second testing location subset being one or both of formed on the second substrate side and configured to be tested via the second substrate side.

A22. The double-sided probe system of any of paragraphs A1-A21, wherein the probe assembly includes one or more probes for testing the one or more DUTs; optionally wherein at least one probe of the one or more probes is configured to interface with a respective testing location of a/the one or more testing locations that is comprised in a corresponding DUT of the one or more DUTs; optionally wherein a/the thermally controlled probe head includes at least a subset of the one or more probes; and optionally wherein the one or more probes is a plurality of probes.

A23. The double-sided probe system of paragraph A22, wherein each probe of the one or more probes is configured to one or both of:

(i) provide a/the test signal to the corresponding DUT; and (ii) receive a/the resultant signal from the corresponding DUT.

A24. The double-sided probe system of any of paragraphs A22-A23, wherein the one or more probes includes one or both of:

(i) a first probe subset, each probe of the first probe subset being operable to test at least a subset of the one or more DUTs via the first substrate side; optionally wherein each probe of the first probe subset is configured to interface with a respective testing location of a/the first testing location subset; and (ii) a second probe subset, each probe of the second probe subset being operable to test at least a subset of the one or more DUTs via the second substrate side; optionally wherein each probe of the second probe subset is configured to interface with a respective testing location of a/the second testing location subset.

A25. The double-sided probe system of paragraph A24, when dependent from paragraph A16, wherein the thermally controlled probe head includes at least a portion of the second probe subset; optionally wherein the thermally controlled probe head includes each probe of the second probe subset.

A26. The double-sided probe system of any of paragraphs A24-A25, wherein the thermal control system is configured such that at least a portion of the second probe subset extends between the thermal control system and the substrate during operative use of the double-sided probe system.

A27. The double-sided probe system of any of paragraphs A22-A26, wherein at least one probe of the one or more probes includes, and optionally is, a vertical probe that is configured to contact the respective testing location in the form of a solder bump.

A28. The double-sided probe system of any of paragraphs A22-A27, wherein at least one probe of the one or more probes includes, and optionally is, a cantilever probe that is configured to contact the respective testing location in the form of a contact pad.

A29. The double-sided probe system of any of paragraphs A22-A28, wherein at least one probe of the one or more probes includes, and optionally is, an optical probe that is configured to be optically and/or electromagnetically coupled with the respective testing location in the form of an optical coupler.

A30. The double-sided probe system of any of paragraphs A22-A29, when dependent from paragraph A16, wherein the one or more probes includes, and optionally is, one or more thermally controlled probes; and wherein one or both of:

(i) the thermally controlled probe head includes the one or more thermally controlled probes; and (ii) a/the second probe subset includes, and optionally is, the one or more thermally controlled probes.

A31. The double-sided probe system of paragraph A30, wherein the double-sided probe system is configured such that, during operative use of the probe assembly:

(i) the one or more thermally controlled probes are in one or both of direct contact and thermal communication with one of the first substrate side and the second substrate side; and (ii) at least a portion of the probe assembly is in one or both of electrical communication and optical communication with the other of the first substrate side and the second substrate side.

A32. The double-sided probe system of any of paragraphs A30-A31, wherein the thermally controlled probe head further includes a base plate that operatively supports the one or more thermally controlled probes relative to the substrate; and wherein the base plate is configured to be spaced apart from the substrate during operative use of the double-sided probe system.

A33. The thermally-controlled probe head of paragraph A32, wherein the base plate is configured to be in thermal communication with the substrate during operative use of the double-sided probe system; and wherein the thermal control system is configured to selectively control a base plate temperature of the base plate.

A34. The double-sided probe system of any of paragraphs A32-A33, wherein the base plate has a thermal mass that is greater than a total thermal mass of the one or more thermally controlled probes, optionally wherein a ratio of the thermal mass of the base plate to the total thermal mass of the one or more thermally controlled probes is one or more of at least 100, at least 1,000, at least 10,000, at least 100,000, and at least 1,000,000.

A35. The double-sided probe system of any of paragraphs A1-A34, wherein the thermal control system includes a heater plate; wherein the heater plate is configured to be spaced apart from the substrate during operative use of the double-sided probe system; wherein the heater plate is in thermal communication with one or more of a/the thermally controlled probe head, a/the base plate, and the substrate; and wherein the thermal control system is configured to selectively vary a heater plate temperature of the heater plate to selectively control one or both of a/the base plate temperature and the substrate temperature.

A36. The double-sided probe system of paragraph A35, wherein the heater plate includes one or more of a resistive heater and a radiative heater.

A37. The double-sided probe system of any of paragraphs A35-A36, wherein the heater plate is configured to heat the substrate via one or more of conductive heat transfer, convective heat transfer, and radiative heat transfer.

A38. The double-sided probe system of any of paragraphs A1-A37, wherein the thermal control system includes a Peltier plate; wherein the Peltier plate is configured to be spaced apart from the substrate during operative use of the double-sided probe system; wherein the Peltier plate is in thermal communication with one or more of a/the thermally controlled probe head, a/the base plate, and the substrate; and wherein the thermal control system is configured to selectively vary a Peltier plate temperature of the Peltier plate to selectively control one or both of a/the base plate temperature and the substrate temperature.

A39. The double-sided probe system of paragraph A38, wherein the Peltier plate is configured to one or both of:

(i) add heat energy to the substrate via one or more of conductive heat transfer, convective heat transfer, and radiative heat transfer; and (ii) remove heat energy from the substrate via one or more of conductive heat transfer, convective heat transfer, and radiative heat transfer.

A40. The double-sided probe system of any of paragraphs A38-A39, wherein the Peltier plate includes a heated region and a cooled region, and wherein the Peltier plate is configured to generate a temperature differential between the heated region and the cooled region.

A41. The double-sided probe system of paragraph A40, wherein one of the heated region or the cooled region is in thermal communication with the one or more of the thermally controlled probe head, the base plate, and the substrate.

A42. The double-sided probe system of any of paragraphs A40-A41, wherein one of:

(i) the heated region is configured to heat the substrate via one or more of conductive heat transfer, convective heat transfer, and radiative heat transfer; and (ii) the cooled region is configured to cool the substrate via one or more of conductive heat transfer, convective heat transfer, and radiative heat transfer.

A43. The double-sided probe system of any of paragraphs A1-A42, wherein the thermal control system includes a fluid conduit configured to convey a thermal fluid into thermal communication with one or more of a/the thermally controlled probe head, a/the base plate, and the substrate; and wherein the thermal control system is configured to selectively vary one or both of a thermal fluid temperature of the thermal fluid and a thermal fluid flow rate of the thermal fluid to selectively control one or both of the base plate temperature and the substrate temperature.

A44. The double-sided probe system of paragraph A43, wherein the fluid conduit is configured such that the thermal fluid facilitates convective heat transfer between the substrate and one or more of:

(i) a/the heater plate;
(ii) a/the Peltier plate; and
(iii) a/the base plate.

A45. The double-sided probe system of any of paragraphs A43-A44, wherein the thermal control system includes a thermal fluid supply source that is configured to supply the thermal fluid to the fluid conduit at one or both of a controlled thermal fluid temperature and a controlled thermal fluid flow rate.

A46. The double-sided probe system of any of paragraphs A43-A45, wherein the thermal fluid includes one or more of a gas, a pressurized gas, air, nitrogen, a noble gas, and argon.

A47. The double-sided probe system of any of paragraphs A1-A46, wherein the thermal control system includes a controller programmed to at least partially control operation of one or both of the double-sided probe system and the thermal control system.

A48. The double-sided probe system of paragraph A47, wherein the controller is programmed to generate a thermal control signal that is configured to at least partially control operation of the thermal control system, optionally wherein the controller is programmed to transmit the thermal control signal to one or more of a/the heater plate, a/the Peltier plate, and a/the thermal fluid supply source.

A49. The double-sided probe system of any of paragraphs A47-A48, wherein the controller is programmed to at least partially control a/the heater plate temperature of a/the heater plate, optionally via a/the thermal control signal.

A50. The double-sided probe system of any of paragraphs A47-A49, wherein the controller is programmed to at least partially control a/the Peltier plate temperature of a/the Peltier plate, optionally via a/the thermal control signal.

A51. The double-sided probe system of any of paragraphs A47-A50, wherein the controller is programmed to at least partially control one or both of:
(i) a/the thermal fluid temperature of a/the thermal fluid, optionally via a/the thermal control signal; and
(ii) a/the thermal flow rate of the thermal fluid, optionally via a/the thermal control signal.

A52. The double-sided probe system of any of paragraphs A1-A51, wherein the thermal control system includes one or more temperature sensors; wherein each temperature sensor of the one or more temperature sensors is configured to measure a respective probe system temperature of at least a portion and/or a region of one or both of the double-sided probe system and the substrate and to generate and transmit a respective temperature signal that represents the respective probe system temperature; optionally wherein each temperature sensor of the one or more temperature sensors is configured to transmit the respective temperature signal to a/the controller; and optionally wherein the respective probe system temperature includes, and optionally is, one or more of the substrate temperature, a/the probe head temperature, a/the base plate temperature, a/the heater plate temperature, a/the Peltier plate temperature, and a/the thermal fluid temperature.

A53. The double-sided probe system of paragraph A52, wherein each temperature sensor of the one or more temperature sensors includes, and optionally is, one or more of a thermometer, a thermocouple, a thermistor, an infrared temperature sensor, a contact temperature sensor, and a non-contact temperature sensor.

A54. The double-sided probe system of any of paragraphs A52-A53, wherein the respective probe system temperature is one of the substrate temperature and a/the base plate temperature.

A55. The double-sided probe system of any of paragraphs A52-A54, when dependent from paragraph A47, wherein the controller is programmed to generate the thermal control signal based, at least in part, on the respective temperature signal of at least one temperature sensor of the one or more temperature sensors.

A56. The double-sided probe system of any of paragraphs A1-A55, further comprising one or more electrical conductors configured to one or more of:
(i) provide electrical power to one or more components of the thermal control system;
(ii) convey a/the respective temperature signal from a/the one or more temperature sensors to a/the controller; and
(iii) convey a/the thermal control signal from the controller to one or more components of the thermal control system.

A57. The double-sided probe system of any of paragraphs A1-A56, wherein the probe assembly includes at least one imaging device configured to generate an optical image of one or both of:
(i) at least a portion and/or region of the double-sided probe system; and
(ii) at least a portion and/or region of the substrate; optionally wherein a/the one or more probes includes the at least one imaging device.

A58. The double-sided probe system of paragraph A57, when dependent from paragraph A16, wherein the at least one imaging device includes, and optionally is, a thermally controlled probe head imaging device configured to generate an optical image of at least a portion and/or region of the thermally controlled probe head, optionally of at least a portion and/or region of the thermally controlled probe head that is configured to interface with the second substrate side.

A59. The double-sided probe system of any of paragraphs A57-A58, wherein the at least one imaging device includes, and optionally is, a substrate imaging device configured to generate an optical image of at least a portion and/or region of the substrate; optionally at least a portion and/or region of the first substrate side; and optionally at least a portion and/or region of the one or more DUTs.

A60. The double-sided probe system of any of paragraphs A1-A59, when dependent from paragraph A16, wherein the probe assembly includes a support arm that operatively supports the thermally controlled probe head relative to one or both of the chuck and the substrate during operative use of the double-sided probe system.

A61. The double-sided probe system of paragraph A60, wherein the support arm operatively supports a/the thermally controlled probe head imaging device relative to one or both of the chuck and the substrate during operative use of the double-sided probe system.

A62. The double-sided probe system of any of paragraphs A60-A61, wherein the support arm extends along a direction at least substantially parallel to each of the first substrate side and the second substrate side.

A63. The double-sided probe system of any of paragraphs A60-A62, wherein the support arm extends at least partially exterior of the chuck, optionally exterior of a/the chuck internal volume.

A64. The double-sided probe system of any of paragraphs A60-A63, wherein the support arm operatively supports at least a portion of a/the fluid conduit.

A65. The double-sided probe system of any of paragraphs A60-A64, wherein the support arm supports at least a portion of a/the thermally controlled probe head imaging device.

A66. The double-sided probe system of any of paragraphs A60-A65, wherein the support arm is positioned between a/the thermally controlled probe head imaging device and a/the base plate; and wherein the support arm includes a support arm aperture that permits light to travel from the base plate to the thermally controlled probe head imaging device.

A67. The double-sided probe system of any of paragraphs A60-A66, wherein the support arm supports at least a portion of a/the one or more electrical conductors.

A68. The double-sided probe system of any of paragraphs A60-A67, wherein the probe assembly further includes a positioner stage that operatively supports the support arm; wherein the support arm is operatively coupled to the positioner stage and extends away from the positioner stage; and wherein the positioner stage is configured to selectively move the support arm relative to the chuck to selectively position the thermally controlled probe head relative to the substrate during operative use of the double-sided probe system.

A69. The double-sided probe system of paragraph A68, wherein the positioner stage is positioned at least partially exterior of one or both of the chuck and a/the chuck internal volume.

A70. The double-sided probe system of paragraph A69, wherein the support arm extends away from the positioner stage and into the a/the chuck internal volume.

A71. The double-sided probe system of any of paragraphs A68-A70, when dependent from paragraph A16, wherein the positioner stage is configured to one or both of:

(i) selectively translate the thermally controlled probe head relative to the chuck; and (ii) selectively rotate the thermally controlled probe head relative to the chuck.

A72. The double-sided probe system of any of paragraphs A1-A71, further comprising a signal generation and analysis assembly that is configured to one or more of:

(i) provide a/the test signal to the probe assembly;

(ii) receive a/the resultant signal from the probe assembly; and (iii) analyze the resultant signal.

B1. A method of operating a double-sided probe system that includes any suitable structure of any of paragraphs A1-A72, the method comprising:

regulating, with the thermal control system, the substrate temperature.

C1. A method of operating a double-sided probe system, the method comprising: regulating, with a thermal control system of a probe assembly of the double-sided probe system, a substrate temperature of a substrate that includes one or more devices under test (DUTs).

C2. The method of paragraph C1, wherein the regulating the substrate temperature includes one or more of:

(i) regulating a/the base plate temperature;

(ii) selectively varying a/the heater plate temperature;

(iii) selectively varying a/the Peltier plate temperature;

(iv) selectively varying a/the thermal fluid temperature of a/the thermal fluid; and (v) selectively varying a/the thermal fluid flow rate of the thermal fluid.

C3. The method of paragraph C2, wherein the regulating the base plate temperature includes one or more of:

(i) the selectively varying the heater plate temperature;

(ii) the selectively varying the Peltier plate temperature;

(iii) the selectively varying the thermal fluid temperature; and (iv) the selectively varying the thermal fluid flow rate of a/the thermal fluid.

C4. The method of any of paragraphs C1-C3, wherein the regulating the substrate temperature includes one or more of:

(i) measuring, with each temperature sensor of a/the one or more temperature sensors, a/the respective probe system temperature of at least a portion and/or region of the double-sided probe system;

(ii) transmitting, with each temperature sensor of the one or more temperature sensors, a/the respective temperature signal, optionally to a/the controller;

(iii) comparing, with a controller, the probe system temperature to a target temperature; and (iv) generating, with the controller, a/the thermal control signal;

(v) transmitting, with the controller, the thermal control signal to another component of the thermal control system, optionally to one or more of a/the heater plate, a/the Peltier plate, and a/the thermal fluid supply source.

C5. The method of paragraph C4, wherein the generating the thermal control signal is based, at least in part, on the comparing the probe system temperature to the target temperature.

C6. The method of any of paragraphs C1-C5, further comprising, concurrently with the regulating the substrate temperature, testing, with the probe assembly, the one or more DUTs.

C7. The method of paragraph C6, wherein the wherein the testing the one or more DUTs includes:

(i) testing at least a subset of the one or more DUTs with a/the first probe subset; and (ii) testing at least a subset of the one or more DUTs with a/the second probe subset.

C8. The method of paragraph C7, wherein the testing with the first probe subset and the testing with the second probe subset are performed concurrently.

C9. The method of any of paragraphs C7-C8, wherein the testing with the first probe subset and the testing with the second probe subset are performed while the substrate remains at least substantially fixed relative to the chuck.

C10. The method of any of paragraphs C6-C9, wherein the testing the one or more DUTs is performed, at least in part, with a/the one or more probes, and optionally with a/the one or more thermally controlled probes.

C11. The method of any of paragraphs C6-C10, wherein the testing the one or more DUTs includes one or more of:

(i) generating, with a/the signal generation and analysis assembly, a/the test signal;

(ii) receiving, with the signal generation and analysis assembly, a/the resultant signal; and (iii) analyzing, with the signal generation and analysis assembly, the resultant signal.

C12. The method of any of paragraphs C6-C11, further comprising, prior to the testing the one or more DUTs, aligning a/the one or more probes with a/the respective testing locations, optionally wherein the aligning the one or more probes includes aligning a/the one or more thermally controlled probes.

C13. The method of paragraph C12, wherein the aligning the one or more probes includes positioning, with a/the positioner stage, the thermally controlled probe head relative to the substrate.

C14. The method of any of paragraphs C12-C13, wherein the aligning the one or more thermally controlled probes includes generating, with a/the thermally controlled probe head imaging device, an/the optical image of at least a portion and/or region of the thermally controlled probe head.

D1. The use, in a double-sided probe system, of a probe assembly that includes a thermal control system to selectively regulate a substrate temperature of a substrate that includes one or more devices under test (DUTs).

D2. The use of the double-sided probe system of any of paragraphs A1-A72 with the method of any of paragraphs C1-C14.

D3. The use of the method of any of paragraphs C1-C14 with the double-sided probe system of any of paragraphs A1-A72.

INDUSTRIAL APPLICABILITY

The double-sided probe systems disclosed herein are applicable to the semiconductor manufacturing and test industries.

It is believed that the disclosure set forth above encompasses multiple distinct inventions with independent utility. While each of these inventions has been disclosed in its preferred form, the specific embodiments thereof as disclosed and illustrated herein are not to be considered in a limiting sense as numerous variations are possible. The subject matter of the inventions includes all novel and non-obvious combinations and subcombinations of the various elements, features, functions and/or properties disclosed herein. Similarly, where the claims recite "a" or "a first" element or the equivalent thereof, such claims should be understood to include incorporation of one or more such elements, neither requiring nor excluding two or more such elements.

It is believed that the following claims particularly point out certain combinations and subcombinations that are directed to one of the disclosed inventions and are novel and non-obvious. Inventions embodied in other combinations and subcombinations of features, functions, elements, and/or properties may be claimed through amendment of the present claims or presentation of new claims in this or a related application. Such amended or new claims, whether they are directed to a different invention or directed to the same invention, whether different, broader, narrower, or equal in scope to the original claims, are also regarded as included within the subject matter of the inventions of the present disclosure.

The invention claimed is:

1. A temperature-controlled, double-sided probe system, comprising:
   a probe assembly configured to test one or more devices under test (DUTs) of a substrate, wherein the probe assembly includes a thermal control system configured to at least partially control a substrate temperature of the substrate while the probe assembly tests the one or more DUTs, wherein the thermal control system includes a fluid conduit configured to convey a thermal fluid into thermal communication with the substrate; and wherein the thermal control system is configured to selectively vary one or both of a thermal fluid temperature of the thermal fluid and a thermal fluid flow rate of the thermal fluid to selectively control the substrate temperature; and
   a chuck configured to support the substrate, wherein the chuck is configured to support the substrate such that the probe assembly has access to each of a first substrate side of the substrate and a second substrate side of the substrate, which is opposite the first substrate side, while the substrate is operatively supported by the chuck.

2. The double-sided probe system of claim 1, wherein the probe assembly includes a thermally controlled probe head configured to test at least one DUT of the one or more DUTs; and wherein the thermal control system is configured to at least partially control a probe head temperature of at least a portion of the thermally controlled probe head while the thermally controlled probe head tests the at least one DUT of the one or more DUTs.

3. The double-sided probe system of claim 2, wherein the probe assembly is configured to interface with a plurality of testing locations of the substrate; wherein each DUT of the one or more DUTs includes at least one corresponding testing location of the plurality of testing locations; wherein the plurality of testing locations includes:
   (i) a first testing location subset, each testing location of the first testing location subset being one or both of formed on the first substrate side and configured to be tested via the first substrate side; and
   (ii) a second testing location subset, each testing location of the second testing location subset being one or both of formed on the second substrate side and configured to be tested via the second substrate side;
   wherein the probe assembly includes a plurality of probes for testing the one or more DUTs, each probe of the plurality of probes being configured to interface with a respective testing location of the plurality of testing locations that is comprised in a corresponding DUT of the one or more DUTs; wherein the plurality of probes includes:
   (i) a first probe subset, each probe of the first probe subset being operable to test at least a subset of the one or more DUTs via the first substrate side; wherein each probe of the first probe subset is configured to interface with a respective testing location of the first testing location subset; and
   (ii) a second probe subset, each probe of the second probe subset being operable to test at least a subset of the one or more DUTs via the second substrate side; wherein each probe of the second probe subset is configured to interface with a respective testing location of the second testing location subset; and
   wherein the thermally controlled probe head includes at least a portion of the second probe subset.

4. The double-sided probe system of claim 3, wherein the second probe subset includes one or more thermally controlled probes; wherein the thermally controlled probe head further includes a base plate that operatively supports the one or more thermally controlled probes relative to the substrate; wherein the base plate is configured to be spaced apart from the substrate and in thermal communication with the substrate during operative use of the double-sided probe system; and wherein the thermal control system is configured to selectively control a base plate temperature of the base plate.

5. The double-sided probe system of claim 4, wherein the thermal control system includes one or both of:
   (i) a heater plate that is configured to be spaced apart from the substrate during operative use of the double-sided probe system; wherein the heater plate is in thermal communication with the base plate; and wherein the thermal control system is configured to selectively vary a heater plate temperature of the heater plate to selectively control the base plate temperature; and
   (ii) a Peltier plate that is configured to be spaced apart from the substrate during operative use of the double-sided probe system; wherein the Peltier plate is in thermal communication with the base plate; and wherein the thermal control system is configured to selectively vary a Peltier plate temperature of the Peltier plate to selectively control the base plate temperature.

6. The double-sided probe system of claim 2, wherein the thermal control system includes:
   a controller programmed to at least partially control operation of the double-sided probe system, wherein the controller is programmed to generate a thermal control signal that is configured to at least partially control operation of the thermal control system; and
   a temperature sensor that is configured to measure the probe head temperature and to generate and transmit a temperature signal that represents the probe head temperature to the controller;
   wherein the controller is programmed to generate the thermal control signal based, at least in part, on the temperature signal.

7. The double-sided probe system of claim 6, wherein the thermal control system includes one or both of:
   (i) a heater plate that is configured to be spaced apart from the substrate during operative use of the double-sided probe system, wherein the thermal control system is configured to selectively vary a heater plate temperature of the heater plate; and
   (ii) a Peltier plate that is configured to be spaced apart from the substrate during operative use of the double-sided probe system, wherein the thermal control system is configured to selectively vary a Peltier plate temperature of the Peltier plate;

wherein the probe head temperature is one of the heater plate temperature or the Peltier plate temperature; and wherein the thermal control signal is configured to at least partially control operation of one or both of the heater plate and the Peltier plate.

8. The double-sided probe system of claim 6, wherein the thermal control system includes:
(i) a fluid conduit configured to convey a thermal fluid into thermal communication with the substrate at a thermal fluid temperature and with a thermal fluid flow rate; and
(ii) a thermal fluid supply source configured to supply the thermal fluid to the fluid conduit at one or both of a controlled thermal fluid temperature and a controlled thermal fluid flow rate;
wherein the probe head temperature is the thermal fluid temperature; and wherein the thermal control signal is configured to at least partially control the thermal fluid supply source to selectively vary one or both of the controlled thermal fluid temperature and the controlled thermal fluid flow rate.

9. The double-sided probe system of claim 1, wherein the probe assembly includes:
a thermally controlled probe head imaging device configured to generate an optical image of at least a portion of the thermally controlled probe head; and
a support arm that operatively supports each of the thermally controlled probe head and at least a portion of the thermally controlled probe head imaging device relative to the substrate.

10. The double-sided probe system of claim 9, wherein the probe assembly includes a positioner stage that operatively supports the support arm; wherein the support arm is operatively coupled to the positioner stage and extends away from the positioner stage along a direction at least substantially parallel to each of the first substrate side and the second substrate side; and wherein the positioner stage is configured to selectively move the support arm relative to the chuck to selectively position the thermally controlled probe head relative to the substrate.

11. The double-sided probe system of claim 1, wherein the chuck is configured to contact the substrate only along a peripheral region of the substrate during operative use of the double-sided probe system.

12. The double-sided probe system of claim 1, wherein the thermal control system includes a thermal fluid supply source that is configured to supply the thermal fluid to the fluid conduit at one or both of a controlled thermal fluid temperature and a controlled thermal fluid flow rate.

13. A method of operating the double-sided probe system of claim 1, wherein the probe assembly includes a thermally controlled probe head including one or more thermally controlled probes configured to test at least one DUT of the one or more DUTs and a base plate that operatively supports the one or more thermally controlled probes relative to the substrate, wherein the thermal control system is configured to at least partially control a probe head temperature of at least a portion of the thermally controlled probe head while the thermally controlled probe head tests the at least one DUT of the one or more DUTs, the method comprising:
regulating, with the thermal control system, the substrate temperature;
wherein the regulating the substrate temperature includes regulating a base plate temperature of the base plate.

14. A method of operating a double-sided probe system, the method comprising:
regulating, with a thermal control system of a probe assembly of the double-sided probe system, a substrate temperature of a substrate that includes one or more devices under test (DUTs); and
concurrently with the regulating the substrate temperature, testing, with the probe assembly, the one or more DUTs;
wherein the testing the one or more DUTs is performed, at least in part, with one or more thermally controlled probes of a thermally controlled probe head of the probe assembly;
wherein the probe assembly includes a support arm that operatively supports the thermally controlled probe head relative to the substrate and a positioner stage that operatively supports the support arm; and
wherein the method further comprises, prior to the testing the one or more DUTs, positioning, with the positioner stage, the thermally controlled probe head relative to the substrate to align the one or more thermally controlled probes with respective testing locations of the one or more DUTs.

15. The method of claim 14, wherein the probe assembly includes a thermally controlled probe head configured to test at least one DUT of the one or more DUTs; wherein the thermally controlled probe head includes one or more thermally controlled probes and a base plate that operatively supports the one or more thermally controlled probes relative to the substrate; and wherein the regulating the substrate temperature includes regulating a base plate temperature of the base plate.

16. The method of claim 14, wherein one or more of:
(i) the thermal control system includes a heater plate that is in thermal communication with a base plate that operatively supports one or more thermally controlled probes relative to the substrate, and the regulating the substrate temperature includes selectively varying a heater plate temperature of the heater plate;
(ii) the thermal control system includes a Peltier plate that is in thermal communication with the base plate, and the regulating the substrate temperature includes selectively varying a Peltier plate temperature of the Peltier plate; and
(iii) the thermal control system includes a fluid conduit configured to convey a thermal fluid into thermal communication with each of the base plate and the substrate, and the regulating the substrate temperature includes one or both of:
(a) selectively varying a thermal fluid temperature of the thermal fluid; and
(b) selectively varying a flow rate of the thermal fluid.

17. The method of claim 16, wherein the thermal control system includes:
a controller programmed to generate a thermal control signal that is configured to at least partially control operation of the thermal control system; and
one or more temperature sensors, wherein each temperature sensor of the one or more temperature sensors is configured to measure a respective probe system temperature of at least a portion of the double-sided probe system and to generate and transmit a respective temperature signal that represents the respective probe system temperature, wherein the respective probe system temperature is one of the base plate temperature, the heater plate temperature, the Peltier plate temperature, the thermal fluid temperature, and the substrate temperature;

wherein the regulating the substrate temperature includes:
(i) measuring, with each temperature sensor of the one or more temperature sensors, the respective probe system temperature;
(ii) transmitting, with each temperature sensor of the one or more temperature sensors, the respective temperature signal;
(iii) comparing, with the controller, the probe system temperature to a target temperature;
(iv) generating, with the controller, the thermal control signal; and
(v) transmitting, with the controller, the thermal control signal to another component of the thermal control system;
wherein the generating the thermal control signal is based, at least in part, on the comparing the probe system temperature to the target temperature.

18. A temperature-controlled, double-sided probe system, comprising:
a probe assembly configured to test one or more devices under test (DUTs) of a substrate, wherein the probe assembly includes a thermal control system configured to at least partially control a substrate temperature of the substrate while the probe assembly tests the one or more DUTs; and
a chuck configured to support the substrate, wherein the chuck is configured to support the substrate such that the probe assembly has access to each of a first substrate side of the substrate and a second substrate side of the substrate, which is opposite the first substrate side, while the substrate is operatively supported by the chuck;
wherein the probe assembly includes a thermally controlled probe head configured to test at least one DUT of the one or more DUTs;
wherein the thermal control system is configured to at least partially control a probe head temperature of at least a portion of the thermally controlled probe head while the thermally controlled probe head tests the at least one DUT of the one or more DUTs;
wherein the probe assembly is configured to interface with a plurality of testing locations of the substrate;
wherein each DUT of the one or more DUTs includes at least one corresponding testing location of the plurality of testing locations;
wherein the plurality of testing locations includes:
(i) a first testing location subset, each testing location of the first testing location subset being one or both of formed on the first substrate side and configured to be tested via the first substrate side; and
(ii) a second testing location subset, each testing location of the second testing location subset being one or both of formed on the second substrate side and configured to be tested via the second substrate side;
wherein the probe assembly includes a plurality of probes for testing the one or more DUTs, each probe of the plurality of probes being configured to interface with a respective testing location of the plurality of testing locations that is comprised in a corresponding DUT of the one or more DUTs;
wherein the plurality of probes includes:
(i) a first probe subset, each probe of the first probe subset being operable to test at least a subset of the one or more DUTs via the first substrate side; wherein each probe of the first probe subset is configured to interface with a respective testing location of the first testing location subset; and
(ii) a second probe subset, each probe of the second probe subset being operable to test at least a subset of the one or more DUTs via the second substrate side; wherein each probe of the second probe subset is configured to interface with a respective testing location of the second testing location subset; and
wherein the thermally controlled probe head includes at least a portion of the second probe subset.

19. The double-sided probe system of claim 18, wherein the second probe subset includes one or more thermally controlled probes; wherein the thermally controlled probe head further includes a base plate that operatively supports the one or more thermally controlled probes relative to the substrate; wherein the base plate is configured to be spaced apart from the substrate and in thermal communication with the substrate during operative use of the double-sided probe system; and wherein the thermal control system is configured to selectively control a base plate temperature of the base plate.

20. The double-sided probe system of claim 19, wherein the thermal control system includes one or both of:
(i) a heater plate that is configured to be spaced apart from the substrate during operative use of the double-sided probe system; wherein the heater plate is in thermal communication with the base plate; and wherein the thermal control system is configured to selectively vary a heater plate temperature of the heater plate to selectively control the base plate temperature; and
(ii) a Peltier plate that is configured to be spaced apart from the substrate during operative use of the double-sided probe system; wherein the Peltier plate is in thermal communication with the base plate; and wherein the thermal control system is configured to selectively vary a Peltier plate temperature of the Peltier plate to selectively control the base plate temperature.

21. A temperature-controlled, double-sided probe system, comprising:
a probe assembly configured to test one or more devices under test (DUTs) of a substrate, wherein the probe assembly includes a thermal control system configured to at least partially control a substrate temperature of the substrate while the probe assembly tests the one or more DUTs; and
a chuck configured to support the substrate, wherein the chuck is configured to support the substrate such that the probe assembly has access to each of a first substrate side of the substrate and a second substrate side of the substrate, which is opposite the first substrate side, while the substrate is operatively supported by the chuck;
wherein the probe assembly includes a thermally controlled probe head configured to test at least one DUT of the one or more DUTs;
wherein the thermal control system is configured to at least partially control a probe head temperature of at least a portion of the thermally controlled probe head while the thermally controlled probe head tests the at least one DUT of the one or more DUTs;
wherein the thermal control system includes:
(i) a controller programmed to at least partially control operation of the double-sided probe system, wherein the controller is programmed to generate a thermal control signal that is configured to at least partially control operation of the thermal control system; and (ii) a temperature sensor that is configured to measure the probe head temperature and to generate and transmit a temperature signal that represents the probe head temperature to the controller;

wherein the controller is programmed to generate the thermal control signal based, at least in part, on the temperature signal; and wherein the thermal control system further includes:

(i) a fluid conduit configured to convey a thermal fluid into thermal communication with the substrate at a thermal fluid temperature and with a thermal fluid flow rate; and (ii) a thermal fluid supply source configured to supply the thermal fluid to the fluid conduit at one or both of a controlled thermal fluid temperature and a controlled thermal fluid flow rate;

wherein the probe head temperature is the thermal fluid temperature; and wherein the thermal control signal is configured to at least partially control the thermal fluid supply source to selectively vary one or both of the controlled thermal fluid temperature and the controlled thermal fluid flow rate.

22. A temperature-controlled, double-sided probe system, comprising:

a probe assembly configured to test one or more devices under test (DUTs) of a substrate, wherein the probe assembly includes a thermal control system configured to at least partially control a substrate temperature of the substrate while the probe assembly tests the one or more DUTs; and a chuck configured to support the substrate, wherein the chuck is configured to support the substrate such that the probe assembly has access to each of a first substrate side of the substrate and a second substrate side of the substrate, which is opposite the first substrate side, while the substrate is operatively supported by the chuck;

wherein the probe assembly includes:

(ii) a thermally controlled probe head imaging device configured to generate an optical image of at least a portion of the thermally controlled probe head; and (ii) a support arm that operatively supports each of the thermally controlled probe head and at least a portion of the thermally controlled probe head imaging device relative to the substrate.

23. The double-sided probe system of claim 22, wherein the probe assembly includes a positioner stage that operatively supports the support arm; wherein the support arm is operatively coupled to the positioner stage and extends away from the positioner stage along a direction at least substantially parallel to each of the first substrate side and the second substrate side; and wherein the positioner stage is configured to selectively move the support arm relative to the chuck to selectively position the thermally controlled probe head relative to the substrate.

24. A method of operating a double-sided probe system, the method comprising:

regulating, with a thermal control system of a probe assembly of the double-sided probe system, a substrate temperature of a substrate that includes one or more devices under test (DUTs);

wherein one or more of:

(i) the thermal control system includes a heater plate that is in thermal communication with a base plate that operatively supports one or more thermally controlled probes relative to the substrate, and the regulating the substrate temperature includes selectively varying a heater plate temperature of the heater plate;

(ii) the thermal control system includes a Peltier plate that is in thermal communication with the base plate, and the regulating the substrate temperature includes selectively varying a Peltier plate temperature of the Peltier plate; and (iii) the thermal control system includes a fluid conduit configured to convey a thermal fluid into thermal communication with each of the base plate and the substrate, and the regulating the substrate temperature includes one or both of:

(a) selectively varying a thermal fluid temperature of the thermal fluid; and (b) selectively varying a flow rate of the thermal fluid.

25. The method of claim 24, wherein the thermal control system includes:

a controller programmed to generate a thermal control signal that is configured to at least partially control operation of the thermal control system; and one or more temperature sensors, wherein each temperature sensor of the one or more temperature sensors is configured to measure a respective probe system temperature of at least a portion of the double-sided probe system and to generate and transmit a respective temperature signal that represents the respective probe system temperature, wherein the respective probe system temperature is one of the base plate temperature, the heater plate temperature, the Peltier plate temperature, the thermal fluid temperature, and the substrate temperature;

wherein the regulating the substrate temperature includes:

(i) measuring, with each temperature sensor of the one or more temperature sensors, the respective probe system temperature;

(ii) transmitting, with each temperature sensor of the one or more temperature sensors, the respective temperature signal;

(iii) comparing, with the controller, the probe system temperature to a target temperature;

(iv) generating, with the controller, the thermal control signal; and (v) transmitting, with the controller, the thermal control signal to another component of the thermal control system;

wherein the generating the thermal control signal is based, at least in part, on the comparing the probe system temperature to the target temperature.

* * * * *

UNITED STATES PATENT AND TRADEMARK OFFICE
CERTIFICATE OF CORRECTION

PATENT NO. : 11,378,619 B2
APPLICATION NO. : 17/111283
DATED : July 5, 2022
INVENTOR(S) : Masahiro Sameshima Page 1 of 1

It is certified that error appears in the above-identified patent and that said Letters Patent is hereby corrected as shown below:

In the Claims

Claim 22, Column 35, Line 41, please delete "(ii)" and insert --(i)-- therefor.

Claim 24, Column 36, Line 6, please insert --)-- between the "s" and the ";".

Signed and Sealed this
Twenty-seventh Day of September, 2022

Katherine Kelly Vidal
*Director of the United States Patent and Trademark Office*